(12) United States Patent
Nakano et al.

(10) Patent No.: US 12,285,840 B2
(45) Date of Patent: Apr. 29, 2025

(54) POLISHING HEAD, POLISHING APPARATUS, AND METHOD OF MANUFACTURING SEMICONDUCTOR WAFER

(71) Applicant: SUMCO CORPORATION, Tokyo (JP)

(72) Inventors: Yuki Nakano, Saga (JP); Ryoya Terakawa, Saga (JP); Takayuki Kihara, Saga (JP); Hiroki Ota, Saga (JP)

(73) Assignee: SUMCO CORPORATION, Tokyo (JP)

( * ) Notice: Subject to any disclaimer, the term of this patent is extended or adjusted under 35 U.S.C. 154(b) by 496 days.

(21) Appl. No.: 17/600,189

(22) PCT Filed: Dec. 27, 2019

(86) PCT No.: PCT/JP2019/051501
§ 371 (c)(1),
(2) Date: Sep. 30, 2021

(87) PCT Pub. No.: WO2020/202682
PCT Pub. Date: Oct. 8, 2020

(65) Prior Publication Data
US 2022/0161388 A1    May 26, 2022

(30) Foreign Application Priority Data

Apr. 5, 2019   (JP) .................. 2019-072485

(51) Int. Cl.
*H01L 21/304*  (2006.01)
*B24B 37/10*   (2012.01)
(Continued)

(52) U.S. Cl.
CPC ............ *B24B 37/32* (2013.01); *B24B 37/102* (2013.01); *H01L 21/30625* (2013.01)

(58) Field of Classification Search
CPC .. H01L 21/304; H01L 21/67742; B24B 37/10
See application file for complete search history.

(56) References Cited

U.S. PATENT DOCUMENTS

| 9,399,277 | B2 | 7/2016 | Yoshida et al. |
| 2009/0291623 | A1* | 11/2009 | Masumura .............. B24B 37/30 451/287 |

(Continued)

FOREIGN PATENT DOCUMENTS

| CN | 101096077 | 1/2008 |
| CN | 101444897 | 6/2009 |

(Continued)

OTHER PUBLICATIONS

Written Opinion issued in International Bureau of WIPO Patent Application No. PCT/JP2019/051501, dated Mar. 24, 2020, along with an English translation thereof.

(Continued)

*Primary Examiner* — Thomas T Pham
(74) *Attorney, Agent, or Firm* — Greenblum & Bernstein. P.L.C.

(57) ABSTRACT

A polishing head includes a first ring-shaped member having an opening; a plate-shaped member that closes the opening on an upper side of the first ring-shaped member; a membrane that closes the opening on a lower side of the first ring-shaped member; a back pad adhered to a lower surface of the membrane; and a second ring-shaped member located below the back pad and having an opening that holds a polishing target workpiece. A space formed by closing the opening of the first ring-shaped member by the plate-shaped member and the membrane includes: a central region; and an outer peripheral region partitioned from the central region by a partition, and an inner peripheral edge region of the second ring-shaped member is located vertically below an outer peripheral edge of the outer peripheral region. A (Continued)

polishing apparatus includes the polishing head, and is used in a method of manufacturing a semiconductor wafer.

13 Claims, 24 Drawing Sheets

(51) Int. Cl.
*B24B 37/32* (2012.01)
*H01L 21/306* (2006.01)

(56) References Cited

U.S. PATENT DOCUMENTS

| | | |
|---|---|---|
| 2015/0311097 A1 | 10/2015 | Yoshida et al. |
| 2016/0176009 A1 | 6/2016 | Yoshida et al. |
| 2021/0023673 A1* | 1/2021 | Ueno .................. B24B 37/32 |

FOREIGN PATENT DOCUMENTS

| | | |
|---|---|---|
| CN | 101528416 | 9/2009 |
| CN | 102131617 | 7/2011 |
| CN | 104275640 | 1/2015 |
| CN | 104942698 | 9/2015 |
| CN | 109478506 | 3/2019 |
| JP | 2008-110407 A | 5/2008 |
| JP | 2018-32714 A | 3/2018 |
| JP | 2018-183820 A | 11/2018 |
| KR | 10-2009-0074056 | 7/2009 |
| TW | 553802 B | 9/2003 |
| TW | 200603943 | 2/2006 |
| TW | 201026436 A1 | 7/2010 |
| TW | 201210741 A1 | 3/2012 |
| TW | 201345656 A | 11/2013 |
| TW | 201540427 A | 11/2015 |

OTHER PUBLICATIONS

International Search Report issued in International Bureau of WIPO Patent Application No. PCT/JP2019/051501, dated Mar. 24, 2020.
Office Action issued in Taiwan Counterpart Patent Appl. No. 109108150, dated Feb. 24, 2021, along with an English translation thereof.
Office Action issued in Taiwan Counterpart Patent Appl. No. 109108150, dated Oct. 21, 2020, along with an English translation thereof.
Office Action issued in Corresponding Korean Patent Application No. 10-2021-7030790, dated Jun. 9, 2023, along with an English translation thereof.
International Preliminary Report on Patentability issued in International Application No. PCT/JP2019/051501, dated Oct. 14, 2021, along with an English translation thereof.
Office Action issued in Corresponding Taiwanese Patent Application No. 109108150, dated Nov. 2, 2021, along with an English translation thereof.
Office Action issued in Corresponding JP Patent Application No. 2021-511115, dated Sep. 27, 2022, along with an English translation thereof.
Office Action issued in Corresponding Taiwanese Patent Application No. 109108150, dated Mar. 2, 2022, along with an English translation thereof.
Office Action Issued in Corresponding CN Patent Application No. 201980095096.5, dated Feb. 27, 2023, along with an English translation thereof.

* cited by examiner

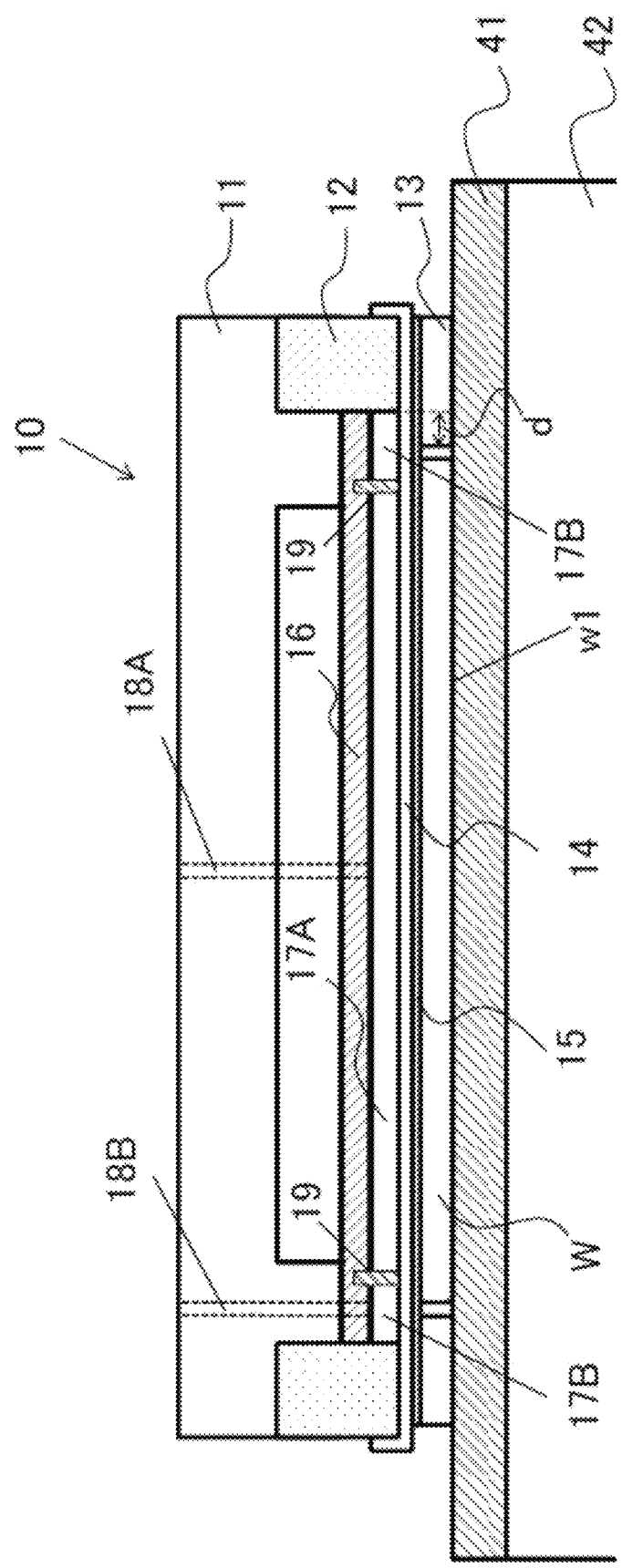

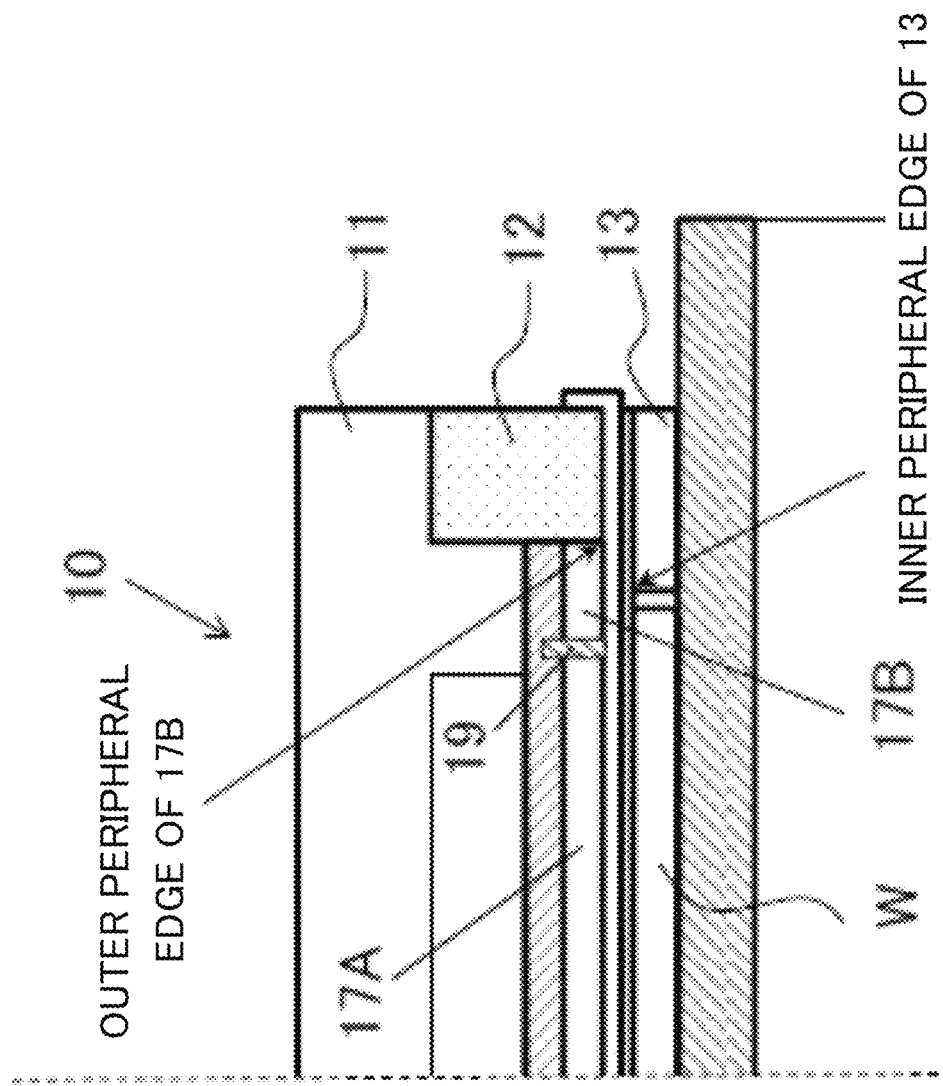

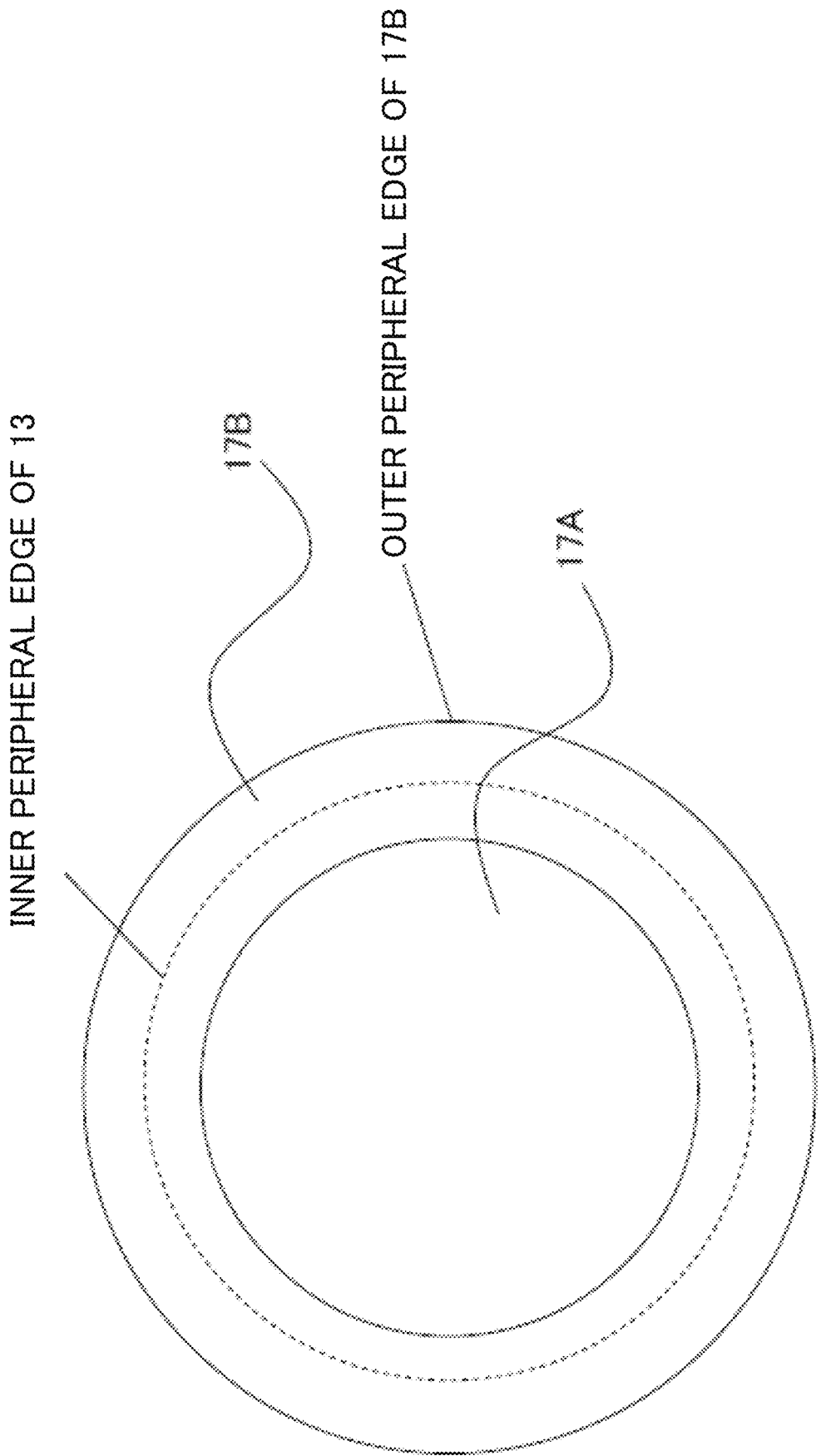

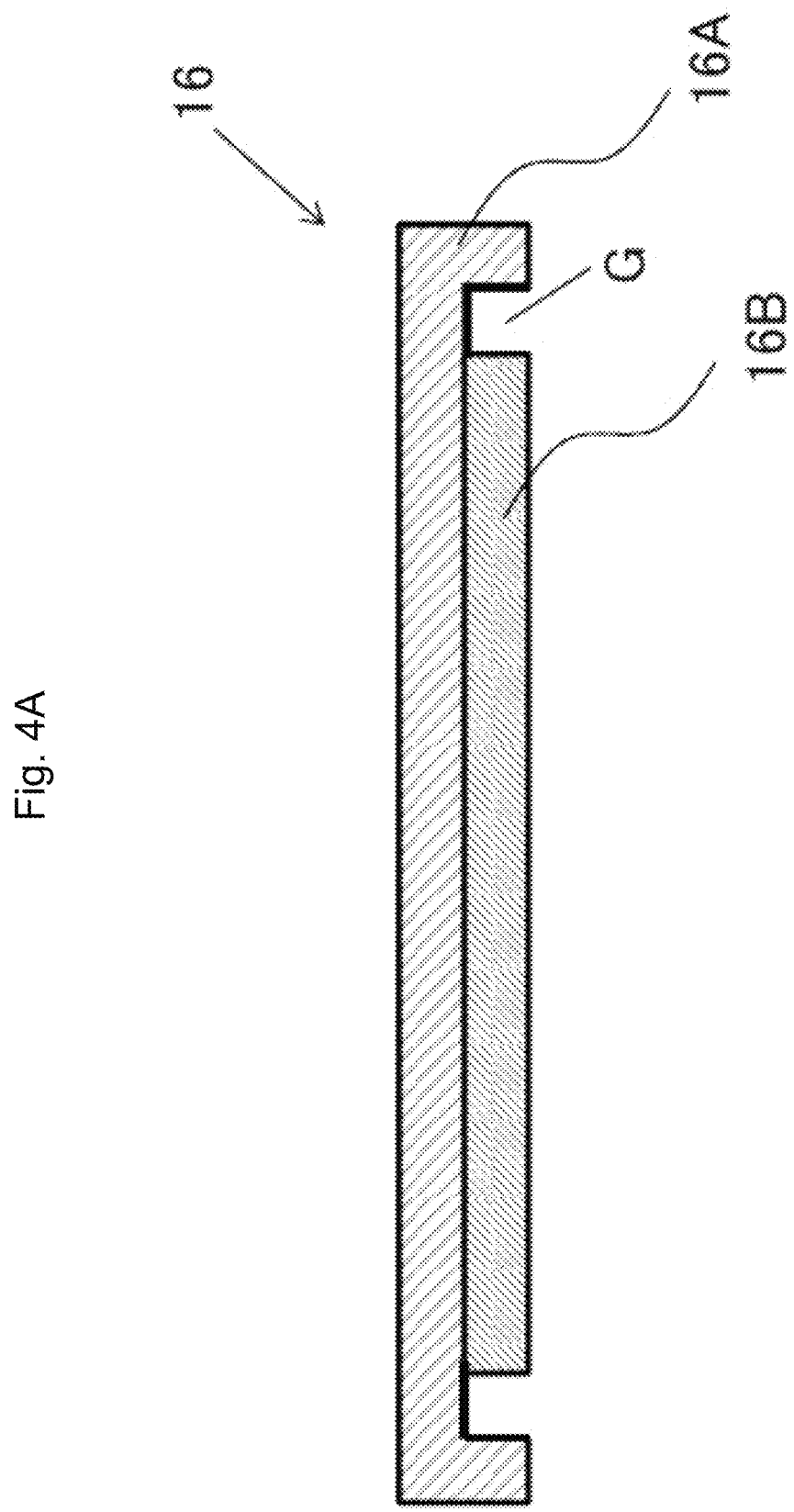

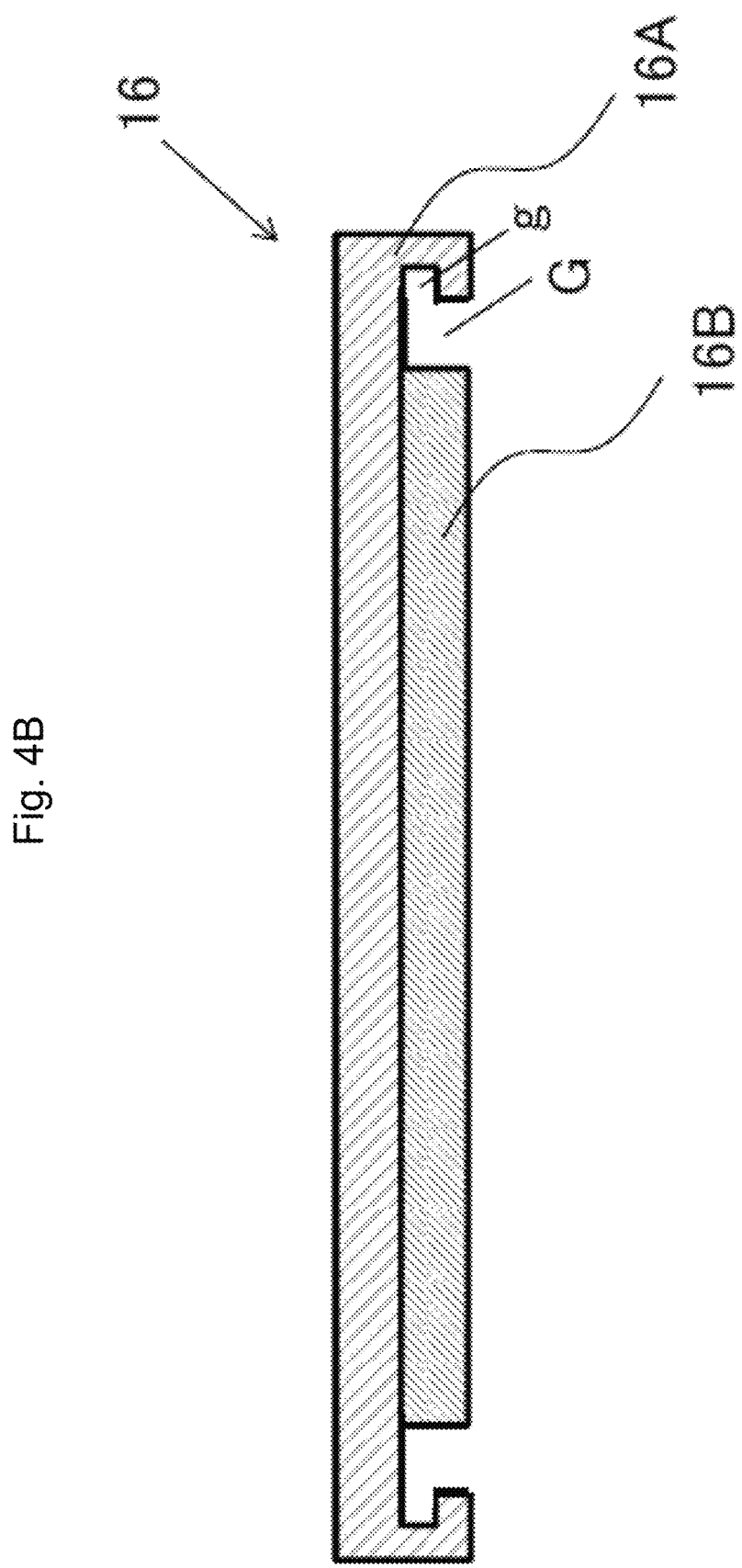

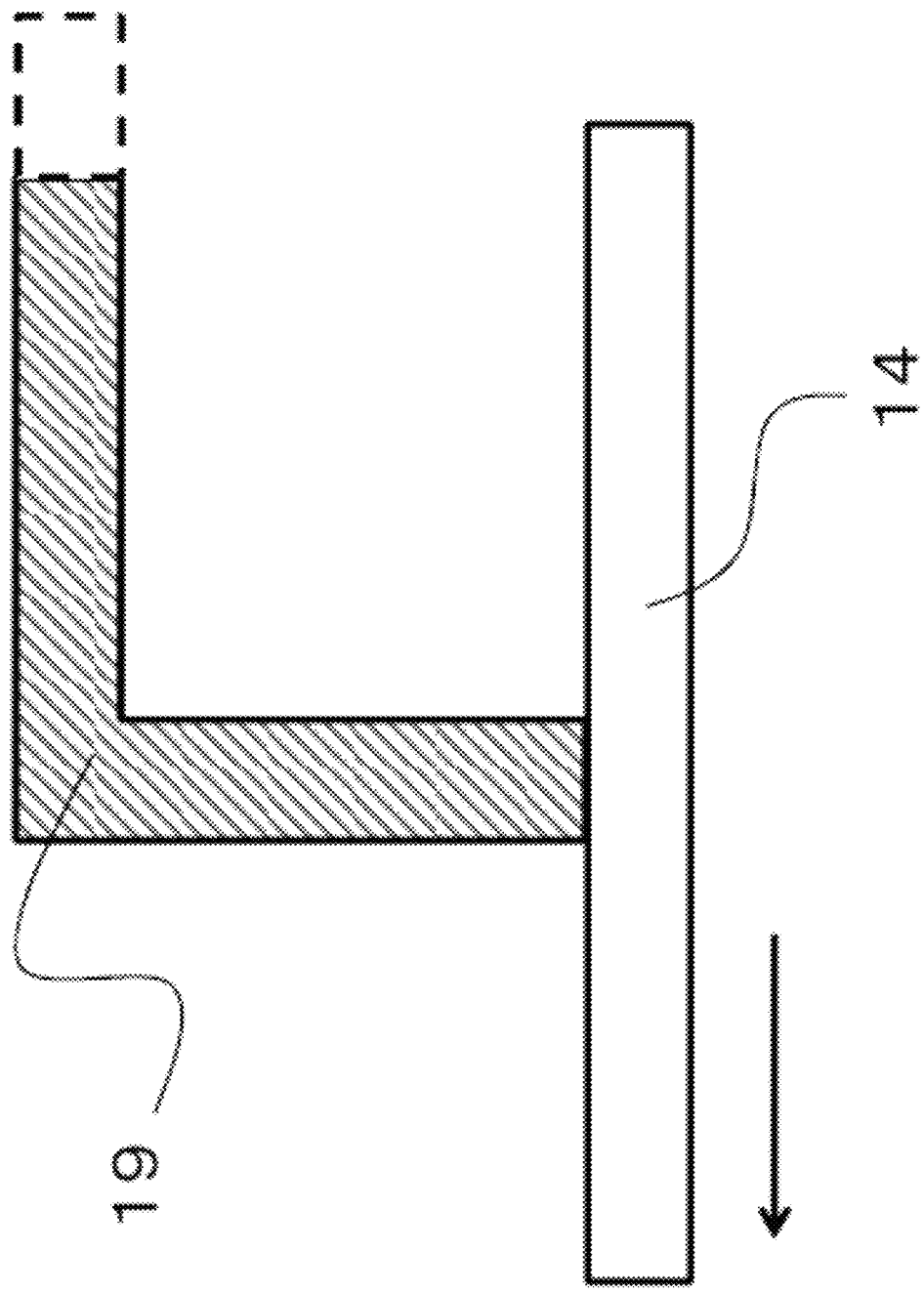

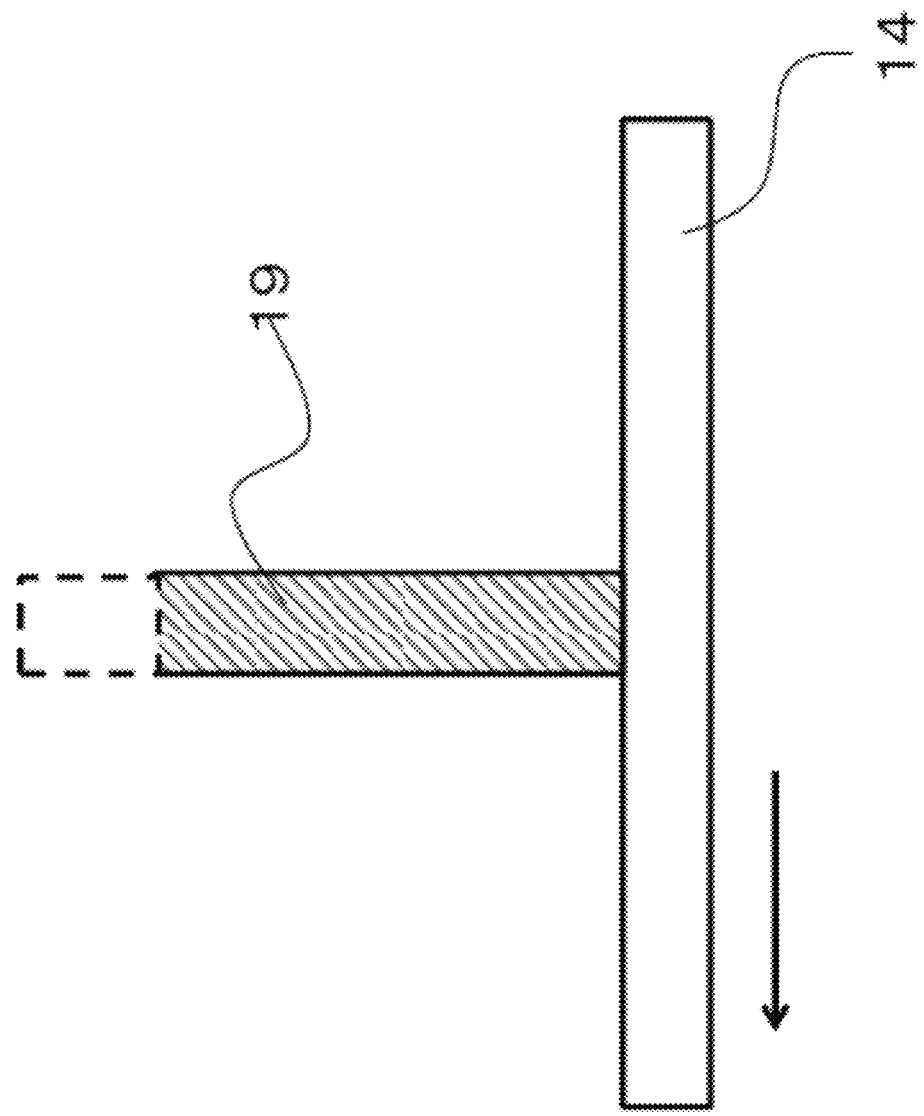

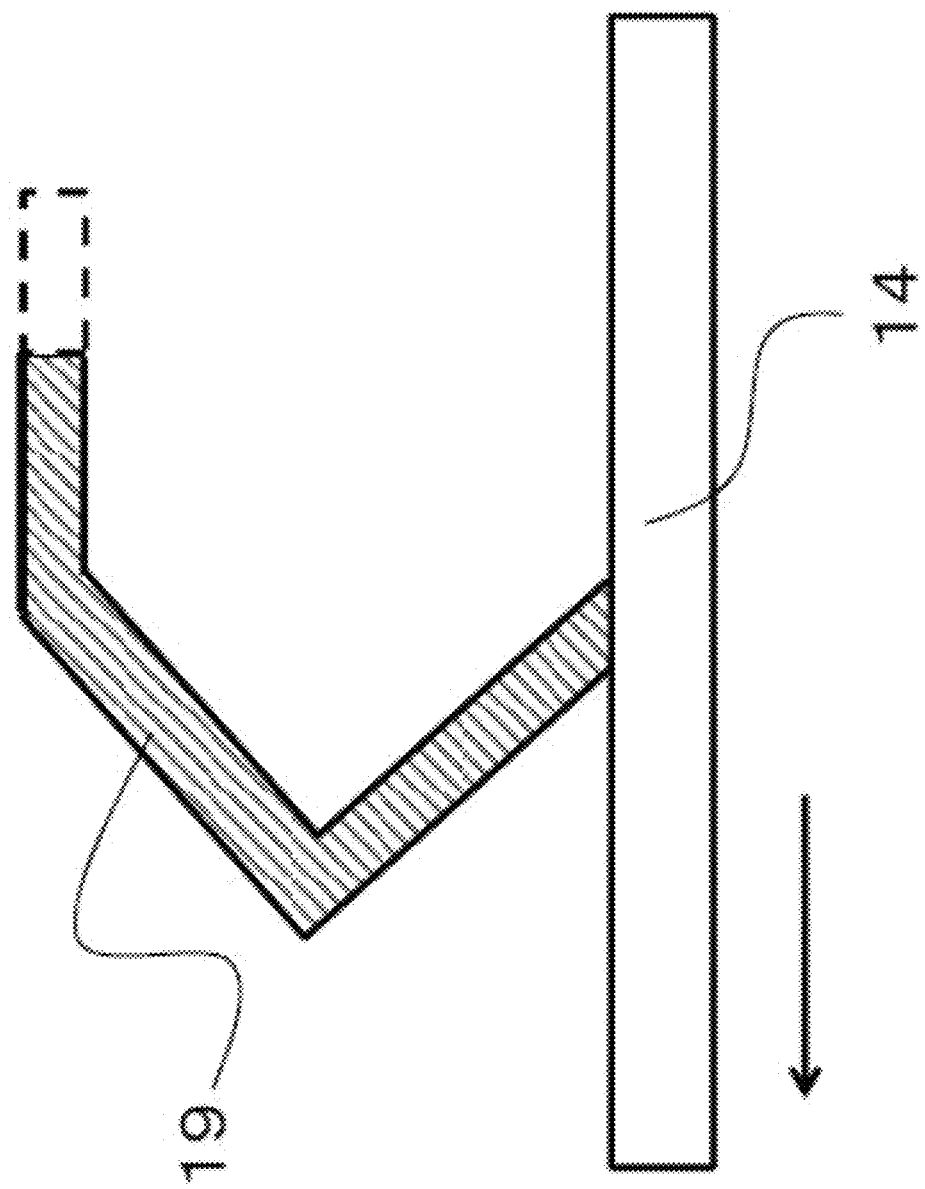

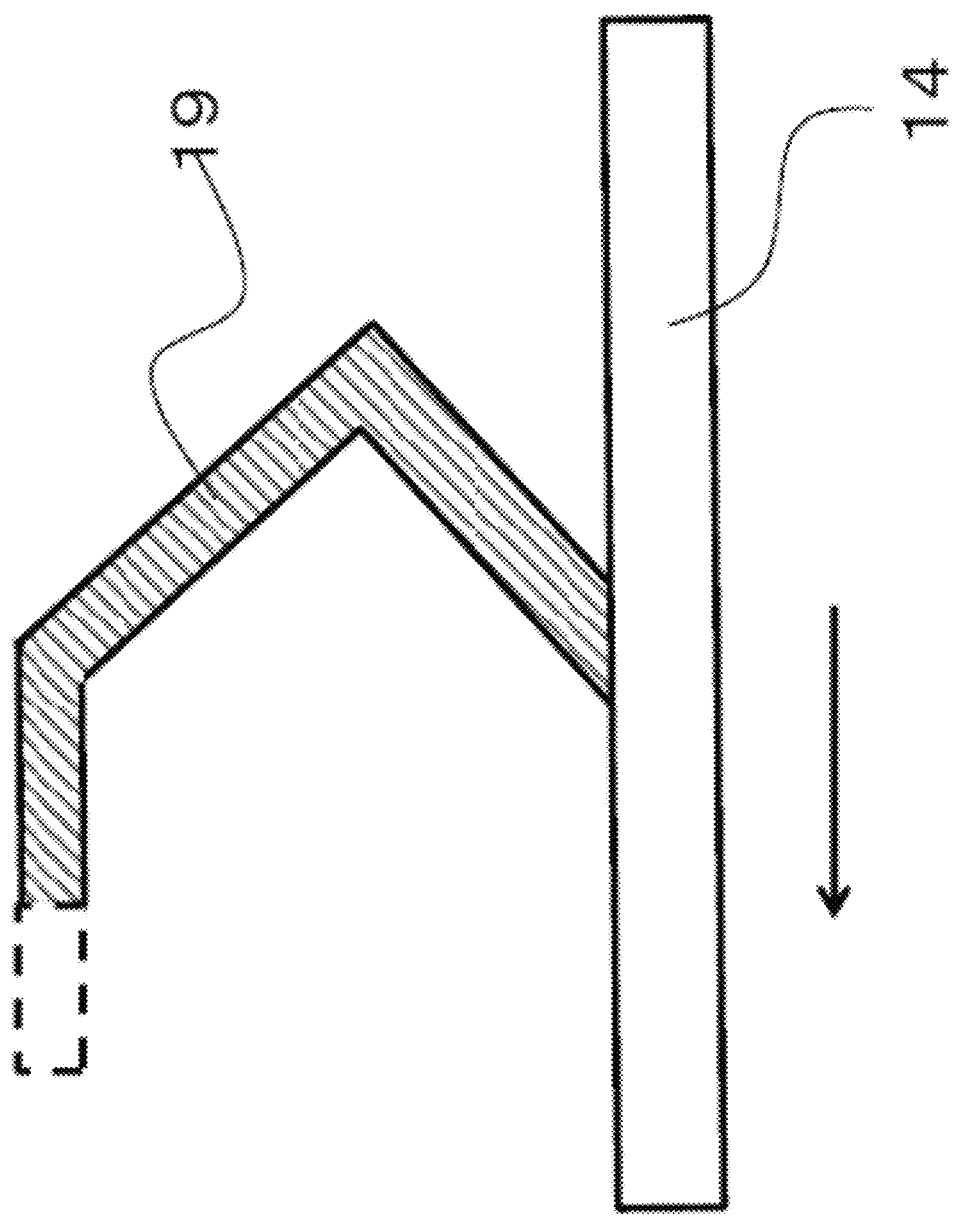

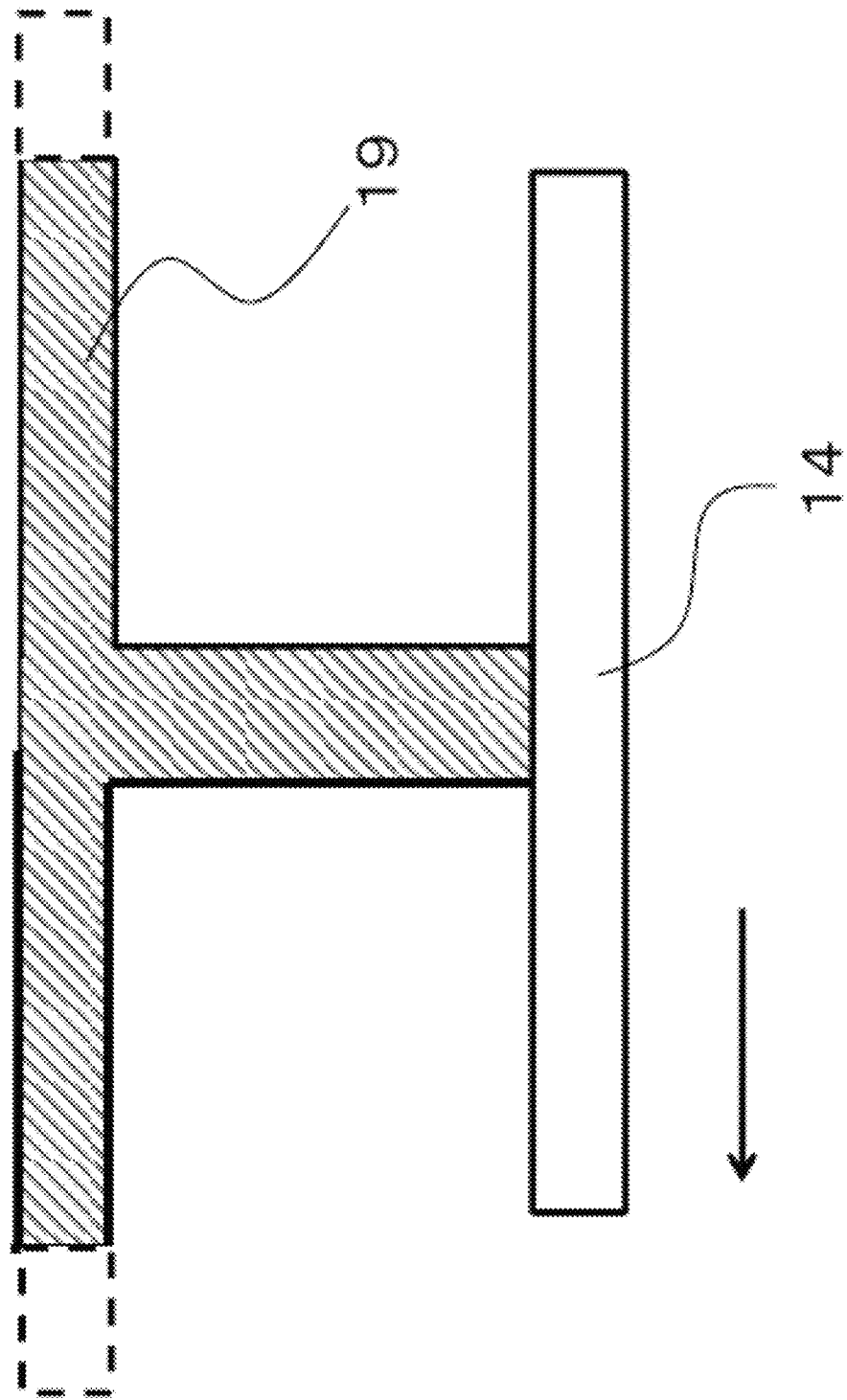

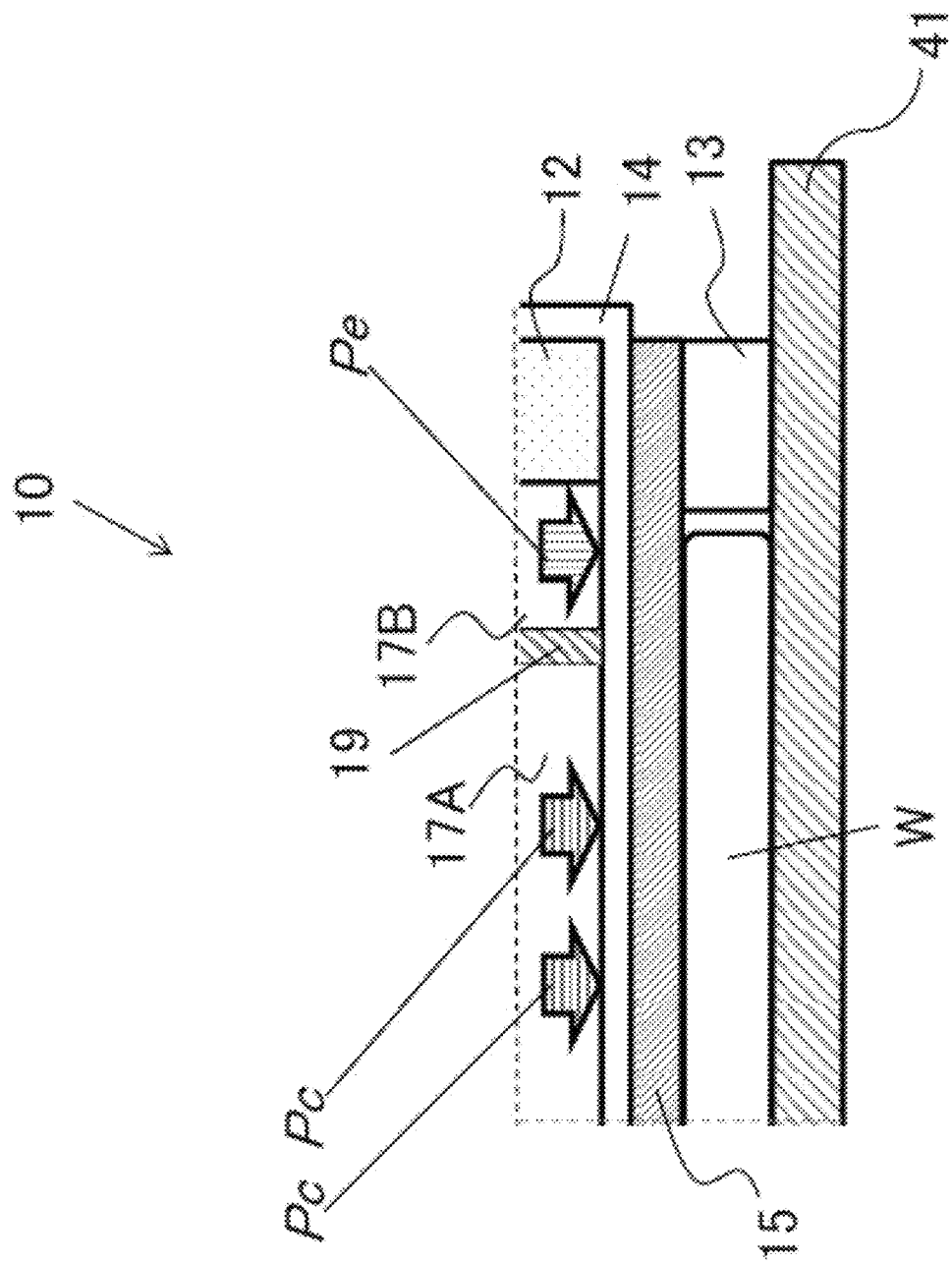

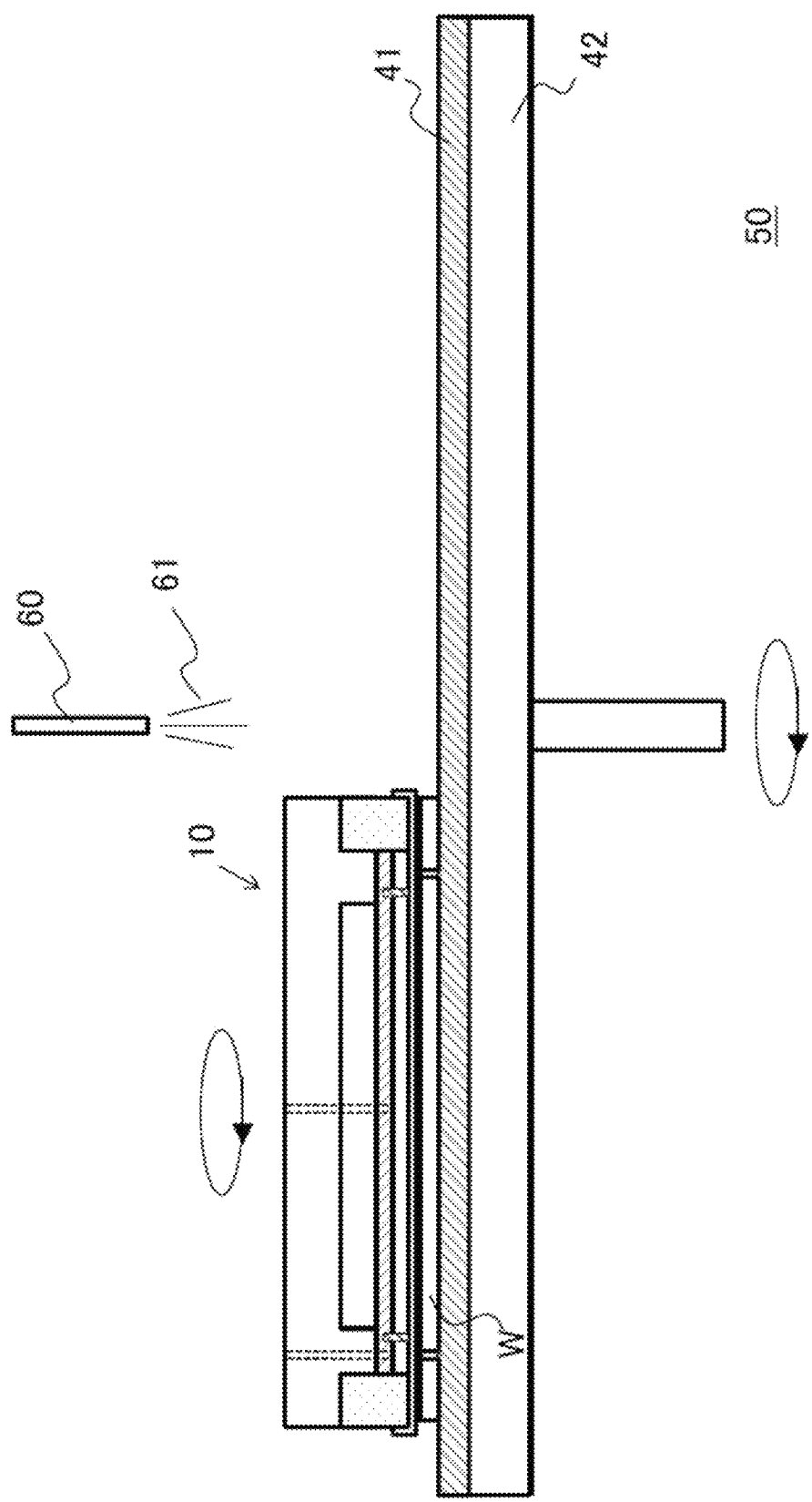

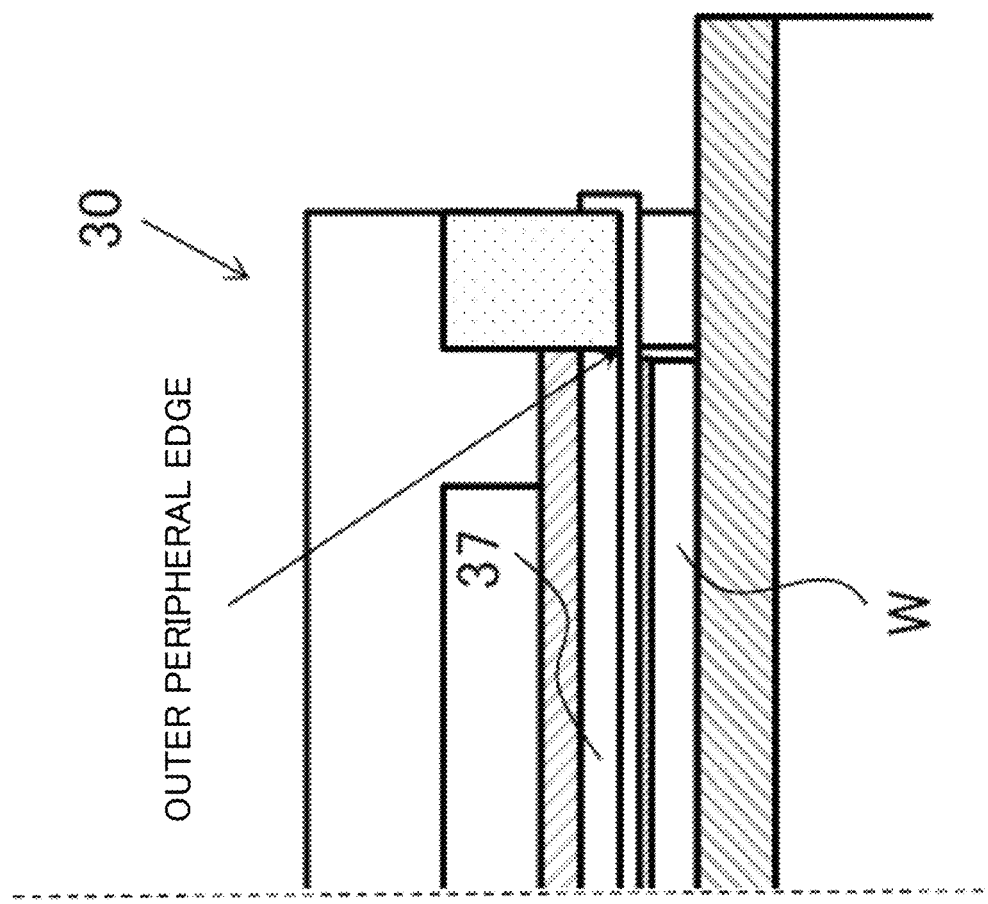

POLISHING HEAD, POLISHING APPARATUS, AND METHOD OF MANUFACTURING SEMICONDUCTOR WAFER

CROSS-REFERENCE TO RELATED APPLICATIONS

This application claims the benefit of priority to Japanese Patent Application No. 2019-72485 filed on Apr. 5, 2019, which is expressly incorporated herein by reference in its entirety.

TECHNICAL FIELD

The present invention relates to a polishing head, a polishing apparatus, and a method of manufacturing a semiconductor wafer.

BACKGROUND ART

As an apparatus that polishes the surface of a workpiece, such as a semiconductor wafer, there are a single-side polishing apparatus that polishes one surface of a workpiece and a double-side polishing apparatus that polishes both surfaces of a workpiece. Normally, in a single-side polishing apparatus, a polishing head and a surface plate are rotated respectively while the polishing target surface of a workpiece held by the polishing head is pressed against a polishing pad adhered to the surface plate, so that the polishing target surface of the workpiece is slide-contacted with the polishing pad. By supplying abrasive to a space between the polishing target surface of the workpiece and the polishing pad which are slide-contacting as such, the polishing target surface of the workpiece can be polished.

For the single-side polishing apparatus described above, a rubber chuck method is known as a method of pressing a workpiece held by the polishing head against the polishing pad (see Japanese Patent Application Publication No. 2008-110407, which is expressly incorporated herein by reference in its entirety).

SUMMARY OF INVENTION

In a case of the rubber chuck type polishing head, gas such as air is introduced into a space behind a membrane (a rubber film in Japanese Patent Application Publication No. 2008-110407) so that the membrane is inflated, thereby a workpiece can be pressed via a back pad (backing pad in Japanese Patent Application Publication No. 2008-110407) which is located below the membrane.

A problem in the case of the conventional single-side polishing apparatus that uses the above rubber chuck type polishing head is that it is difficult to control the polishing amount of the outer peripheral portion of the polishing target surface of a workpiece. If the polishing surface pressure that is applied to the outer peripheral portion of the polishing target surface of the workpiece is controlled easily, it becomes easy to control the polishing amount of the outer peripheral portion of the polishing target surface of the workpiece.

An aspect of the present invention provides a polishing head which can easily control the polishing surface pressure that is applied to the outer peripheral portion of a polishing target surface of a workpiece.

An aspect of the present invention relates to a polishing head that includes:
a first ring-shaped member having an opening;
a plate-shaped member that closes the opening on an upper side of the first ring-shaped member;
a membrane that closes the opening on a lower side of the first ring-shaped member;
a back pad adhered to a lower surface of the membrane; and
a second ring-shaped member located below the back pad and having an opening that holds a polishing target workpiece, wherein
a space formed by closing the opening of the first ring-shaped member by the plate-shaped member and the membrane has:
a central region; and
an outer peripheral region partitioned from the central region by a partition, and
an inner peripheral edge region of the second ring-shaped member is located vertically below an outer peripheral edge of the outer peripheral region.

In the case of the above polishing head, the membrane is inflated by introducing gas into the space, whereby the polishing surface pressure can be applied to the polishing target surface of the workpiece that is held at the opening of the second ring-shaped member. In a polishing head where the outer peripheral portion of the polishing target surface of a workpiece is located vertically below the outer peripheral edge of the space, the polishing surface pressure that is applied to the outer peripheral portion of the polishing target surface of the workpiece is easily influenced by various factors, such as a difference of material of the polishing pad, and a change in the thickness of members due to abrasion. It is assumed that this makes it difficult to control the polishing surface pressure that is applied to the outer peripheral portion of the polishing target surface of the workpiece. In contrast, in the case of the above polishing head, the inner peripheral edge region of the second ring-shaped member holding the workpiece is located at the opening, vertically below the peripheral outer edge of the space. Further, in the above polishing head, the space includes the outer peripheral region, which is an independent space partitioned from the central region by the partition. Therefore, the polishing surface pressure that is applied to the outer peripheral portion of the polishing target surface of the workpiece can be controlled in various ways by adjusting the amount of gas that is introduced to the outer peripheral region of the space independently from the amount of gas that is introduced to the central region thereof. As a consequence, with the above polishing head, the polishing surface pressure that is applied to the outer peripheral portion of the polishing target surface of the workpiece can be easily controlled.

In an embodiment, in the above polishing head, the back pad may be disposed between the outer peripheral portion on the lower surface of the membrane and an annular upper surface of the second ring-shaped member.

In an embodiment, the above polishing head may include an introducing path that introduces gas into the central region, and an introducing path that introduces gas into the outer peripheral region.

An aspect of the present invention relates to a polishing apparatus that includes:
the above polishing head;
a polishing pad; and
a surface plate that supports the polishing pad.

An aspect of the present invention relates to a method of manufacturing a semiconductor wafer, the method including polishing a surface of a polishing target wafer with the above polishing apparatus to form a polished surface.

With the polishing head according to an aspect of the present invention, the polishing surface pressure that is applied to the outer peripheral portion of the polishing target surface of the workpiece can be easily controlled. Furthermore, according to an aspect of the present invention, a polishing apparatus that includes this polishing head and a method of manufacturing a semiconductor wafer using this polishing apparatus can be provided.

BRIEF DESCRIPTION OF DRAWINGS

FIG. 1 is a schematic cross-sectional view indicating an example of the polishing head according to an aspect of the present invention.

FIG. 2 is an enlarged view of a part of the polishing head indicated in FIG. 1.

FIG. 3 is a top view indicating an example of a positional relationship between the space and the second ring-shaped member.

FIG. 4A is a schematic cross-sectional view indicating an example of the plate-shaped member.

FIG. 4B is a schematic cross-sectional view indicating an example of the plate-shaped member.

FIG. 5A indicates an example of the cross-sectional shape of the partition that partitions the central region and the outer peripheral region of the space of the polishing head.

FIG. 5C indicates an example of the cross-sectional shape of the partition that partitions the central region and the outer peripheral region of the space of the polishing head.

FIG. 5D indicates an example of the cross-sectional shape of the partition that partitions the central region and the outer peripheral region of the space of the polishing head.

FIG. 5E indicates an example of the cross-sectional shape of the partition that partitions the central region and the outer peripheral region of the space of the polishing head.

FIG. 5F indicates an example of the cross-sectional shape of the partition that partitions the central region and the outer peripheral region of the space of the polishing head.

FIG. 6 is a diagram for explaining pressure that is applied from the space of the polishing head to the membrane.

FIG. 7 is a schematic cross-sectional view indicating an example of the polishing apparatus.

FIG. 18 is an enlarged is of a part of the polishing head indicated in FIG. 17.

DESCRIPTION OF EMBODIMENTS

[Polishing Head]

Figure 5B:
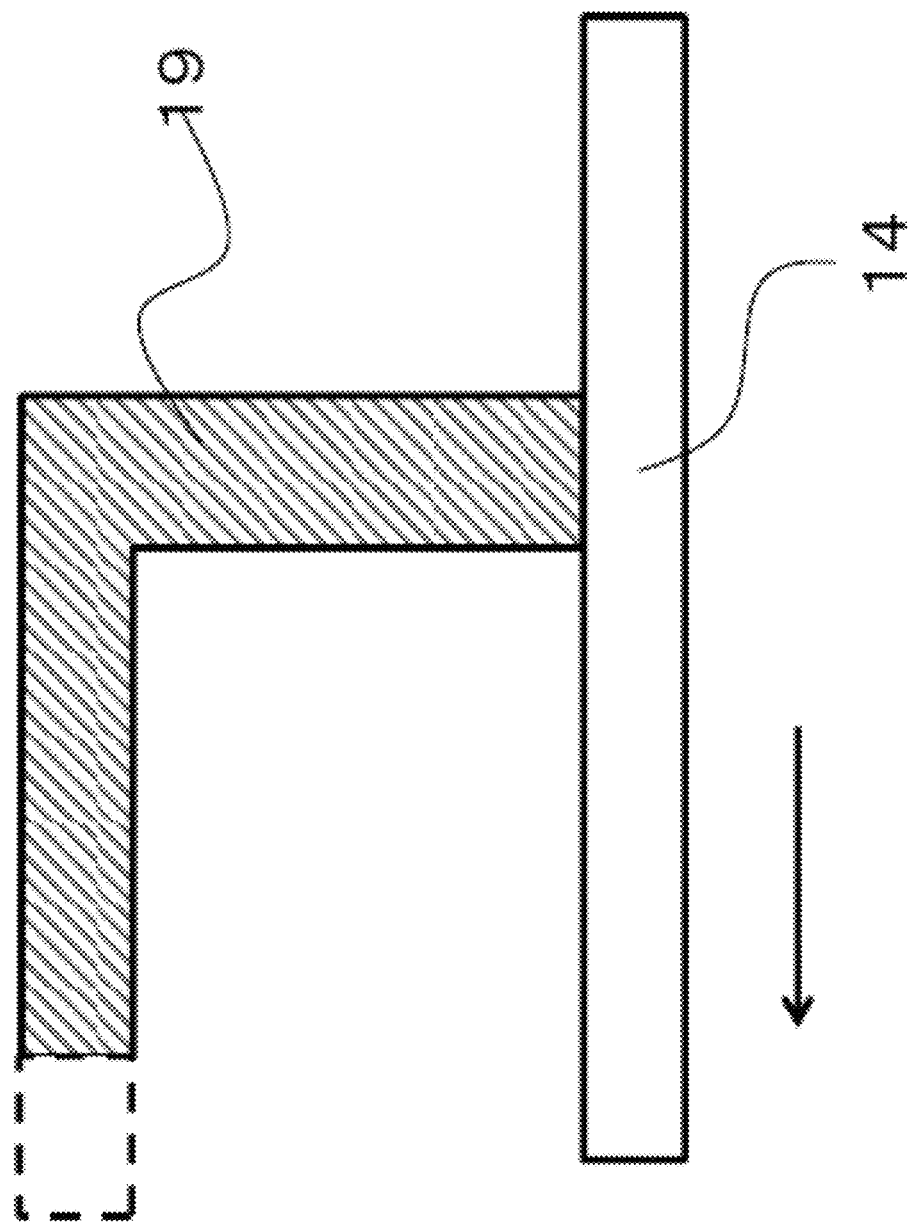
FIG. 5B indicates an example of the cross-sectional shape of the partition that partitions the central region and the outer peripheral region of the space of the polishing head.

The polishing head according to an aspect of the present invention includes: a first ring-shaped member having an opening; a plate-shaped member that closes the opening on the upper side of the first ring-shaped member; a membrane that closes the opening on the lower side of the first ring-shaped member; a back pad adhered to the lower surface of the membrane; and a second ring-shaped member located below the back pad and having an opening that holds a polishing target workpiece. Further, the space formed by closing the opening of the first ring-shaped member with the plate-shaped member and the membrane has a central region and an outer peripheral region partitioned from the central region by a partition, and an inner peripheral edge region of the second ring-shaped member is located vertically below the outer peripheral edge of the outer peripheral region.

The above polishing head will be further described in detail. In the present invention and present description, such expressions as "lower surface", "below", "upper surface", and the like refer to "lower surface", "below", "upper surface" and the like in the case where the polishing head is disposed in a state of performing the polishing processing. In the following, the present invention will be described with reference to the drawings, but the embodiments indicated in the drawings are examples, and the present invention is not limited to these embodiments. In the drawings, the same portions are denoted with a same reference sign.

Figure 17:
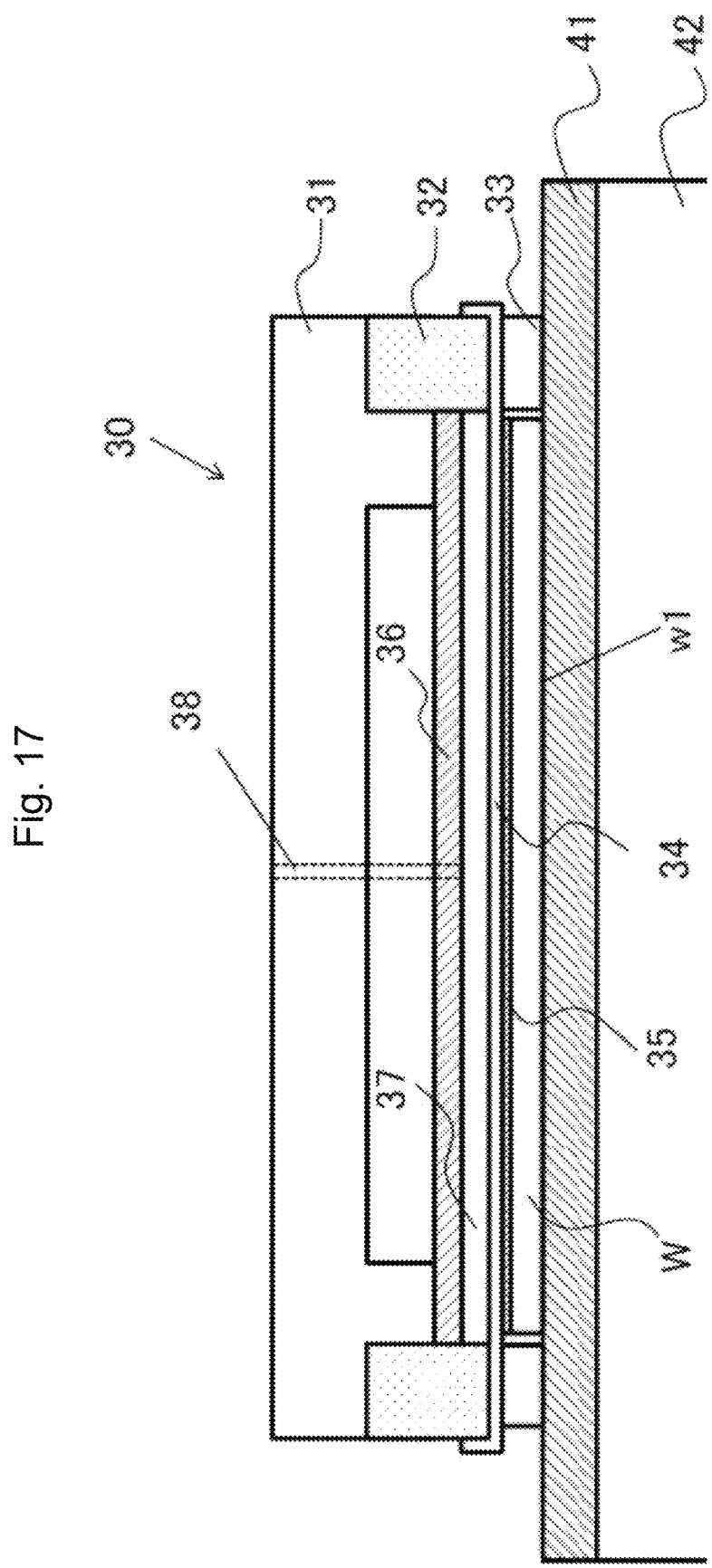
FIG. 17 is a schematic cross-sectional view indicating an example of a conventional polishing head.

FIG. 17 is a schematic cross-sectional view indicating an example of a conventional polishing head. In FIG. 17, a rigid ring 32 is connected to a head main unit 31 in the polishing head 30. A lower surface of the rigid ring 32 is covered with a membrane 34. Further, a back pad 35 is adhered to a lower surface of the membrane 34. A space 37 is formed on the back surface side of the membrane 34 by closing the opening of the rigid ring 32 with an intermediate plate 36 and the membrane 34. By introducing gas as air into the space 37 via a gas introducing path 38 to inflate the membrane 34, a workpiece W, held at the opening of a retainer ring 33, can be pressed via the back pad 35. The pressed workpiece W is pushed against a polishing pad 41 adhered to a surface plate 42. When the polishing head 30 and the surface plate 42 are rotated respectively by a rotating mechanism (not illustrated), a polishing target surface w1 of the workpiece and the polishing pad are slide-contacted.

FIG. 18 is an enlarged view of a part of the polishing head indicated in FIG. 17. As illustrated in FIG. 17, the rigid ring 32 and the retainer ring 33 have the same inner diameter and are disposed concentrically, hence the inner peripheral edge region of the retainer ring 33 is not located vertically below the outer peripheral edge of the space 37, as illustrated in FIG. 18. In the polishing head having such a configuration, in a case where gas is introduced into the space 37 to inflate the membrane 34 and thereby pressure is applied to an area below the space, it is difficult to control the polishing surface pressure at the outer peripheral portion of the polishing target surface of the workpiece located vertically below the outer peripheral edge of the space 37.

FIG. 1 is a schematic cross-sectional view indicating an example of a polishing head according to an aspect of the present invention. In FIG. 1, a first ring-shaped member 12 is connected to a head main unit 11 in the polishing head 10. A lower surface of the first ring-shaped member 12 is covered with a membrane 14. Further, a back pad 15 is adhered to a lower surface of the membrane 14. The membrane 14 includes a partition 19. Thereby an opening of the first ring-shaped member 12 is closed with a plate-shaped member 16 and the membrane 14, and a space that has a central region 17A and an outer peripheral region 17B partitioned from the central region 17A by the partition 19 is formed on a back surface of the membrane 14. By introducing gas into the central region 17A via a gas introducing path 18A and introducing gas into the outer peripheral region 17B via a gas introducing path 18B, for which a gas introducing amount can be controlled independently from the gas introducing path 18A, the membrane 14 can be inflated and a workpiece W can be pressed via the back pad 15.

FIG. 2 is an enlarged view of a part of the polishing head indicated in FIG. 1. A second ring-shaped member 13 holds the workpiece W at an opening thereof. An inner peripheral edge region of the second ring-shaped member 13 is located vertically below the outer peripheral edge of the outer peripheral region 17B of the space. The inner peripheral edge region refers to the inner peripheral edge and a peripheral portion thereof. That is, when the direction toward the center of the opening of the second ring-shaped member 13 is the inner side and the opposite direction thereof is the outer side, the inner peripheral edge of the second ring-shaped member 13 is located at the inner side relative to the outer peripheral edge of the outer peripheral region 17B of the space. The partition 19 is located at the inner side relative to the inner peripheral edge of the second ring-shaped member 13. FIG. 3 is a top view indicating an example of a positional relationship between the space and the second ring-shaped member 13.

Further, the polishing head 10 includes the outer peripheral region 17B, which is an independent space partitioned from the central region 17A by the partition. For example, by changing the amount of gas that is introduced into the central region 17A via the gas introducing path 18A from the amount of gas that is introduced into the outer peripheral region 17B via the gas introducing path 18B, the polishing surface pressure that is applied to the outer peripheral portion of the polishing target surface w1 of the workpiece W below the outer peripheral region 17B can be controlled independently from the polishing surface pressure that is applied to the central portion of the polishing target surface w1 of the workpiece W below the central region 17A.

The above polishing head having the configuration as described above can easily control the polishing surface pressure that is applied to the outer peripheral portion of the polishing target surface of the workpiece.

Each portion constituting the above polishing head will be further described.

For the first ring-shaped member 12, an annular ring made of a rigid material, such as stainless steel (SUS), which is commonly used for a polishing head of a single-side polishing apparatus, may be used. For the head main unit 11 in which the first ring-shaped member 12 is installed, a head main unit which is commonly used for a polishing head of a single-side polishing apparatus (for example, head main unit made of SUS) may be used. The first ring-shaped member 12 may be installed in the head main unit 11 by a known method, such as bolting.

The opening on the lower side of the first ring-shaped member 12 is covered with the membrane 14, so as to be closed. In terms of preventing a positional deviation when the membrane is inflated, it is preferable that the annular lower surface of the first ring-shaped member is also covered with the membrane. Covering the annular lower surface of the first ring-shaped member with the membrane is also preferable in terms of preventing the entry of abrasive into the opening of the first ring-shaped member. The membrane 14 may be adhered to the annular lower surface of the first ring-shaped member 12 by a known method, such as adhesive. It is also preferable to adhere the membrane 14 so as to extend to the side surface of the first ring-shaped member, as illustrated in FIG. 1 and FIG. 2. Thus, the opening on the lower side of the first ring-shaped member 12 is closed. Further, the opening on the upper side of the first ring-shaped member 12 is closed by the plate-shaped member 16. Thereby the opening of the first ring-shaped member 12 is closed and the space is formed. In an embodiment, it is preferable that the height of the space (in other words, distance between the lower surface of the plate-shaped member 16 and the upper surface of the membrane 14) is about 3.5 to 5.5 mm in a state where gas is not introduced into the space to inflate the membrane, since the in-plane distribution of the polishing surface pressure that is applied to the polishing target surface of the workpiece W can be controlled with higher precision. The height of the space may be adjusted depending on the size of the partition, for example, which will be described later. As the membrane 14, a film made of an elastic material, such as rubber, may be used. As the rubber, fluoro-rubber, for example, may be used. The thickness of the membrane 14 is not specifically limited, and may be about 0.5 to 2 mm, for example. The plate-shaped member 16 may be a disk-shaped plate, for example, and may be installed in the head main unit 11 by a known method, such as bolting. In the plate-shaped member 16, a through hole constituting a part of the gas introducing path 18A for introducing gas into the central region of the space and a through hole constituting a part of the gas introducing path 18B for introducing gas into the outer peripheral region of the space are formed. FIG. 1 indicates the embodiment where one gas introducing path for introducing gas into the central region of the space, and one gas introducing path for introducing gas into the outer peripheral region of the space are formed respectively, but two or more gas introducing paths 18A or 18B may be disposed at arbitrary positions, and a number and positions of the gas introducing paths are not limited to the embodiment indicated in the drawings.

The membrane 14 has a partition 19. The space formed by closing the opening of the first ring-shaped member 12 with the plate-shaped member 16 and the membrane 14 is parted into the central region 17A and the outer peripheral region 17B by this partition 19. For example, the partition 19 may be installed in the plate-shaped member 16 by inserting a ring-shaped member (partition 19) into an annular groove formed in the plate-shaped member 16. The plate-shaped member 16, for example, is constituted of a first plate-shaped member 16A having a concaved portion and a second plate-shaped member 16B disposed in the concaved portion, and has an annular groove G, as illustrated in FIG. 4A and FIG. 4B. The second plate-shaped member 16B may be installed in the first plate-shaped member 16A by a known method, such a bolting. In the annular groove G, a recess g to insert the partition having such a cross-section as L-shaped (described later), for example, may be disposed in an arbitrary position in accordance with the shape of the partition.

FIG. 5A to FIG. 5F indicates examples of cross-sectional shapes of the partition 19. In each figure, the dotted line portion indicates a connection portion with the plate-shaped member 16, and the arrow mark indicates the direction to the center of the first ring-shaped member 12. According to one embodiment, the partition 19 may have an L-shaped cross-section, as illustrated in FIG. 5A and FIG. 5B. According to another embodiment, the partition 19 may have an I-shaped cross-section, as illustrated in FIG. 5C. According to yet another embodiment, the partition 19 may have a cross-section including a V-shaped portion, as illustrated in FIG. 5D and FIG. 5E. And according to yet another embodiment, the partition 19 may have a T-shaped cross-section, as illustrated in FIG. 5F. The partition 19 may be fabricated by molding resin, metal or the like into a desired shape, for example. It is preferable that the partition 19 has a thickness that ensures strength to maintain the shape thereof when gas is introduced into the space and pressure is applied to the partition 19, and the thickness may be about 0.5 to 1.5 mm, for example.

The partition 19 and the membrane 14 may be fabricated as separate members, and be adhered to each other using adhesive or the like, but it is preferable that the partition 19 is integrally molded with the membrane 14 because of the following reason. If a gap is generated between the partition 19 and the membrane 14, air flow may be generated between the central region 17A and the outer peripheral region 17B parted by the partition 19. In contrast, if the partition 19 and the membrane 14 are integrally molded as one member, the central region 17A and the outer peripheral region 17B can be parted by the partition 19 without generating such an air flow. Furthermore, if the partition 19 and the membrane 14 are fabricated as separate members, it is not easy to adhere the partition 19 and the membrane 14 to each other uniformly in the circumferential direction, and if the adhering state is uneven, the uniformity of the pressure that is applied to the workpiece may drop. Alternatively, if a raised portion is generated in the membrane by the adhesive, the polishing surface pressure may differ between the raised portion and the other portion. As a consequence, it is preferable that the partition 19 is integrally molded with the membrane 14. In a case where the partition 19 has a relatively simple shape, such as an L-shaped cross-section indicated in FIG. 5A and FIG. 5B, or an !-shaped cross-section indicated in FIG. 5C, molding thereof is easy regardless whether the partition 19 is integrally molded with the membrane 14 or not.

FIG. 6 is a diagram for explaining pressure that is applied from the space to the membrane. In the above polishing head, the space formed by closing the opening of the first ring-shaped member is partitioned into the central region 17A and the outer peripheral region 17B. Pressure that is applied to the central portion of the membrane 14, when the central portion of the membrane 14 is inflated by the gas introduced into the central region 17A, is referred to as "central portion control pressure Pc", and pressure that is applied to the outer peripheral portion of the membrane 14, when the outer peripheral portion of the membrane 14 is inflated by the gas introduced into the outer peripheral region 17B, is referred to as "outer peripheral portion control pressure Pe". The values Pc and Pe can be controlled independently from each other by the amount of gas introduced into each region of the space. Pc and Pe may be determined in accordance with the hardness of the polishing target workpiece, the material of the polishing pad, the type of abrasive to be used, and the like.

The back pad 15 is adhered to the lower surface of the membrane 14. The back pad 15 can be adhered to the lower surface of the membrane 14 using a known method, such as adhesive. The outer peripheral portion of the lower surface of the membrane 14 may directly contact with the annular upper surface of the second ring-shaped member 13, but in terms of preventing peeling and waviness of the back pad 15, it is preferable that the back pad 15 is disposed between the outer peripheral portion of the lower surface of the membrane 14 and the annular upper surface of the second ring-shaped member 13, so that the back pad 15 is interposed between the outer peripheral portion of the lower surface of the membrane 14 and the annular upper surface of the second ring-shaped member. As the back pad 15, a disk-shaped plate made of a material which becomes absorptive due to surface tension when water is absorbed, such as foamed polyurethane may be used. Thereby the workpiece W can be held by the back pad 15 that contains water.

The second ring-shaped member 13 is a member for holding a workpiece W in the opening thereof, and is also called a "retainer", a "retainer ring", or the like. The second ring-shaped member 13 may be a glass epoxy ring-shaped member, for example. The second ring-shaped member 13 may be adhered to the back pad 15 by a known method, such as adhesive. In the above polishing head, an inner peripheral edge region of the second ring-shaped member (more precisely, the inner peripheral side region of the annular upper surface of the second ring-shaped member), is located vertically below the outer peripheral edge of the outer peripheral region of the space, which is formed by closing the opening of the first ring-shaped member 12. Thereby the polishing target surface w1 of the workpiece W can be polished without disposing the outer peripheral portion of the polishing target surface w1 of the workpiece W vertically below the outer peripheral edge of the space. For example, by disposing the second ring-shaped member, the inner diameter of which is smaller than the inner diameter of the first ring-shaped member, concentrically with the first ring-shaped member, the inner peripheral edge region of the second ring-shaped member can be disposed vertically below the outer peripheral edge of the space formed by closing the opening of the first ring-shaped member. In terms of easily controlling the polishing surface pressure that is applied to the outer peripheral portion of the polishing target surface of the workpiece, it is preferable that a region, with the width from the inner peripheral edge toward the outer periphery side ("d" in FIG. 1) ranging from about 8 to 25 mm, is located below the outer peripheral region 17B of the space, on the annular upper surface of the second ring-shaped member. The thickness of the second ring-shaped member 13 may be determined in accordance with the thickness of the polishing target workpiece W. The diameter of the opening of the second ring-shaped member 13 may also be determined in accordance with the diameter of the workpiece W to be polished. The second ring-shaped member 13 may be a ring-shaped member made of material commonly used for a retainer ring of a polishing head.

The second ring-shaped member 13 normally slide-contacts with the polishing pad 41 during polishing. To the second ring-shaped member, pressure, which is arbitrarily applied to the head main unit 11 by a pressure control mechanism (not illustrated) during polishing, and pressure due to the weight of the second ring-shaped member itself, are applied, hence in some cases the second ring-shaped member 13 may be polished and worn down by slide-contacting with the polishing pad 41, and thickness thereof may be decreased. As the thickness of the second ring-shaped member 13 decreases, the polishing surface pressure applied to the outer peripheral portion of the polishing target surface w1 of the workpiece W tends to increase. Therefore, in the case where the thickness of the second ring-shaped member 13 decreases, the outer peripheral portion control pressure Pe may be decreased by decreasing the amount of gas introduced into the outer peripheral region 17B of the space. Then, over-polishing of the outer peripheral portion of the polishing target surface w1 of the workpiece W, caused by a decrease in the thickness of the second ring-shaped member 13, can be prevented.

The workpiece W, which is polished by the single-side polishing apparatus, equipped with the polishing head according to an aspect of the present invention described above, may be various semiconductor wafers, such as silicon wafers, for example.

[Polishing Apparatus and Method of Manufacturing Semiconductor Wafer]

An aspect of the present invention relates to a polishing apparatus, including the above polishing head, a polishing pad and a surface plate that supports the polishing pad.

Another aspect of the present invention relates to a method of manufacturing a semiconductor wafer, including polishing a surface of a polishing target wafer with the above polishing apparatus to form a polished surface.

FIG. 7 is a schematic cross-sectional view indicating an example of the polishing apparatus according to an aspect of the present invention. While rotating the polishing head 10 and the surface plate 42 respectively using a rotation mechanism (not illustrated), a polishing target surface of a workpiece W and the polishing pad 41 adhered to the surface plate 42 are slide-contacted. Abrasive 61 discharged from an abrasive supply mechanism 60 is supplied to a space between the polishing target surface of the workpiece W and the polishing pad 41, and the polishing target surface of the workpiece W is polished. As the abrasive, polishing slurry, which is normally used for chemical mechanical polishing (CMP), may be used. The above polishing apparatus may have the same configuration as a commonly used single-side polishing apparatus, except that the polishing head according to an aspect of the present invention is included. Further, for the above method of manufacturing a semiconductor wafer, a known technique related to a method of manufacturing a semiconductor wafer having a polished surface may be used, except that the polished surface is formed by polishing the surface of the polishing target wafer using the polishing apparatus of the present invention. The polishing target wafer may be a silicon wafer (preferably a single crystal silicon wafer), for example. The silicon wafer may be fabricated by the following method, for example: a single-crystal ingot is pulled out by the Czochralski method, and a block is acquired by cutting the fabricated ingot. Then, wafers are fabricated by slicing the acquired block. By performing various processing operations on the wafers, silicon wafers can be fabricated. The above processing may include chamfering, planarization (lapping, grinding, polishing), and the like. The above polishing apparatus can be suitably used for the final polishing step, which is the last step of the wafer processing.

EXAMPLES

The present invention will be described below with reference to Examples. The present invention, however, is not limited to the embodiments of the Examples. The polishing surface pressure in the following description is a value determined based on the pressure calculation (finite element method) using Abaqus made by Dassault Systèmes S.E. In the figures described below, "a.u." indicates "arbitrary unit".

Comparative Example 1

Figure 8:
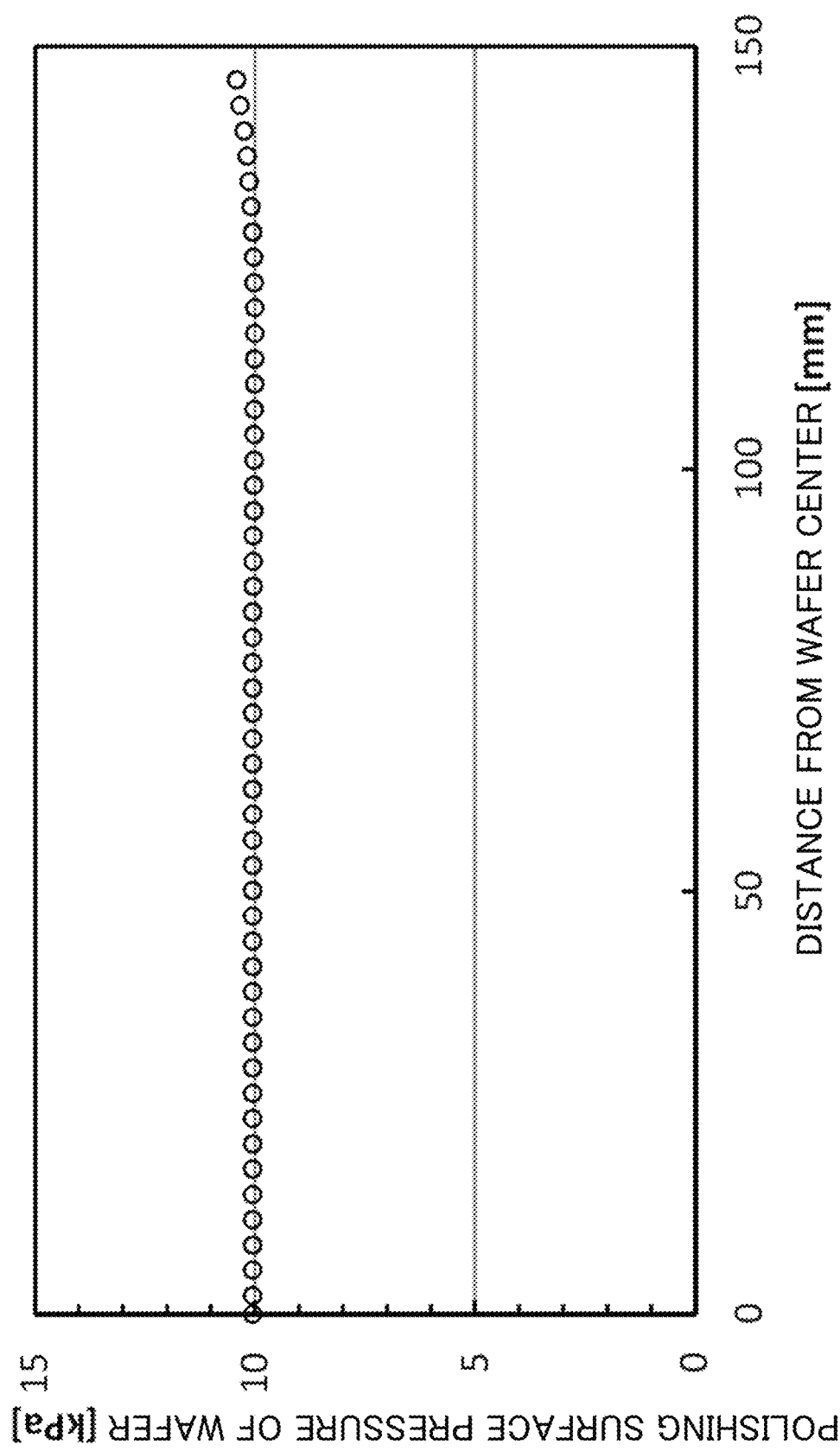
FIG. 8 is a graph indicating an in-plane distribution of the polishing surface pressure that is applied to the polishing target surface of a workpiece in Comparative Example 1.

FIG. 8 indicates an in-plane distribution of the polishing surface pressure that is applied to the polishing target surface of a 300 mm diameter silicon wafer (workpiece) in the single-side polishing apparatus equipped with the polishing head having the configuration indicated in FIG. 17. In the polishing head used in Comparative Example 1, the space 37 is a single space, hence the membrane 34 is inflated by gas that is introduced via the gas introducing path 38, and the polishing surface pressure that is applied to the polishing target surface w1 of the workpiece W is approximately the same in each portion on the plane.

Figure 9:
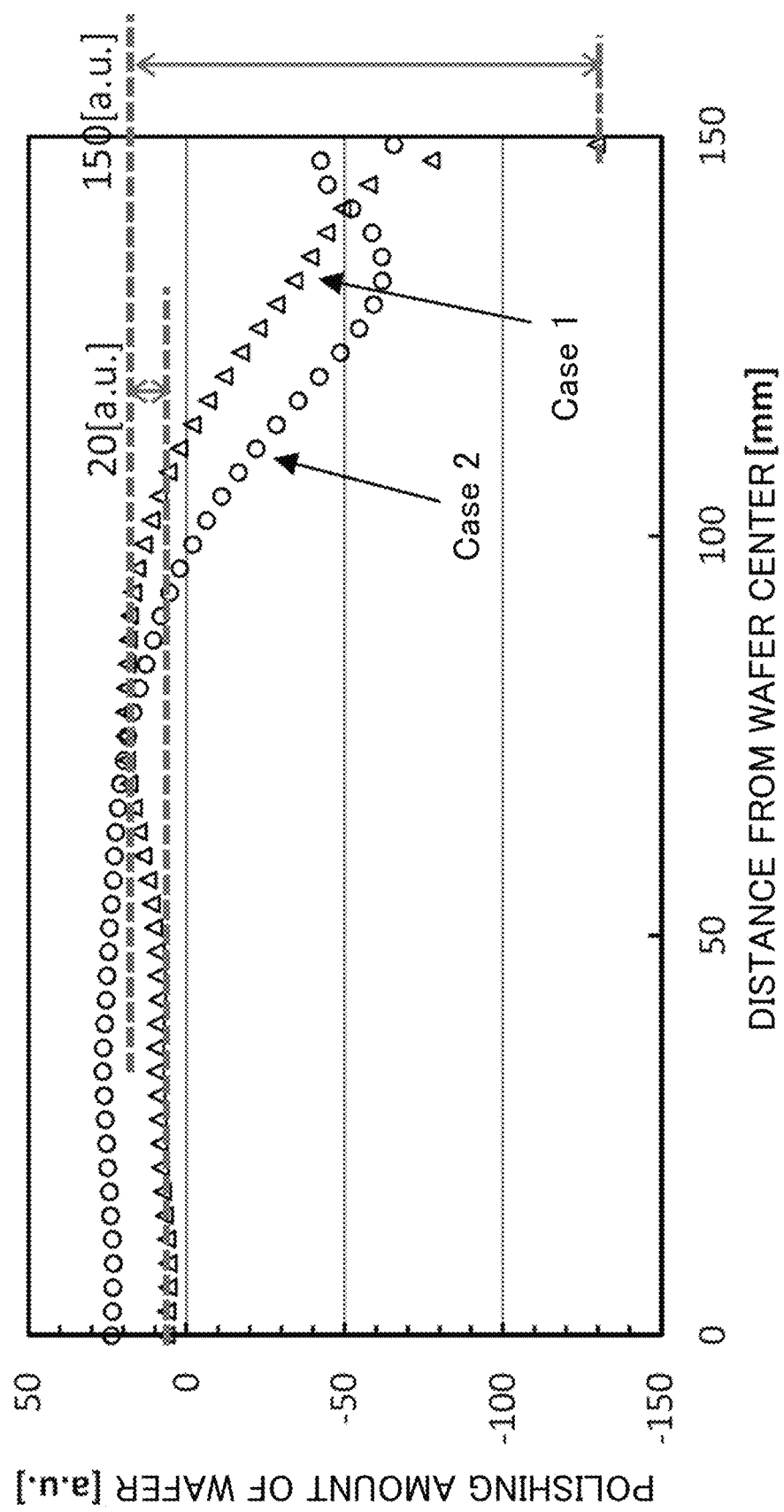
FIG. 9 is a graph indicating an in-plane polishing amount distribution on the polishing target surface of the workpiece in Comparative Example 1.

In FIG. 9, Case 1 and Case 2 are graphs indicating the in-plane polishing amount distribution on the polishing target surface of the wafer in a case where polishing was performed using the same single-side polishing apparatuses under the same conditions except that the amount of gas introduced into the space is different. The polishing surface pressure of Case 1 is 10 kPa, and the polishing surface pressure of Case 2 is 20 kPa. The polishing amount was calculated by a Preston equation. Each polishing amount described later was also calculated by a Preston equation. The result in FIG. 9 indicates that, in the case of the single-side polishing apparatus used in Comparative Example 1, it is difficult to control the polishing amount in the outer peripheral portion of the polishing target surface located vertically below the outer peripheral edge of the space. As a result, as indicated in FIG. 9, in a case of the single-side polishing apparatus used in Comparative Example 1, it was difficult to make the polishing amount of the outer peripheral portion of the polishing target surface close to the polishing amount of the central portion by adjusting the amount of gas introduced into the space.

Example 1

Figure 10:
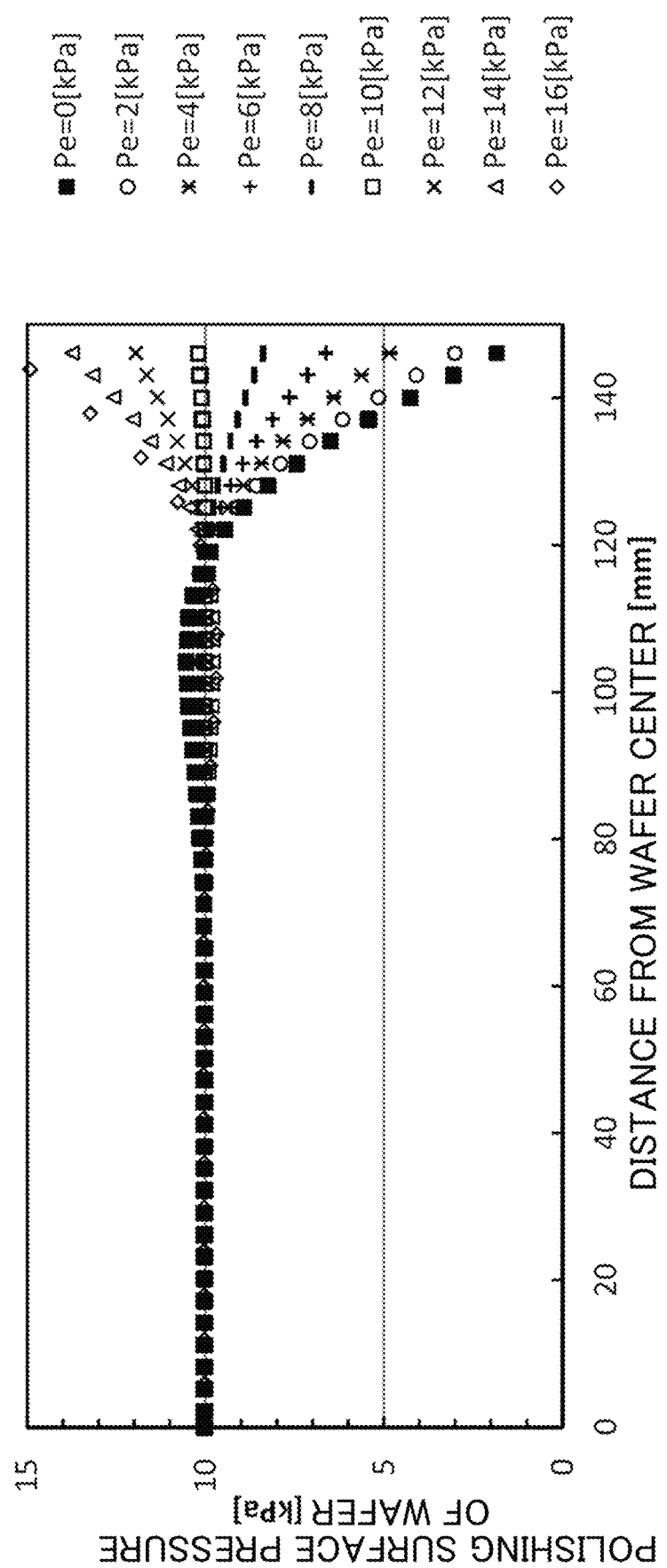
FIG. 10 is a graph indicating an in-plane distribution of the polishing surface pressure that is applied to the polishing target surface of a workpiece in a case of changing the outer peripheral portion control pressure Pe in Example 1.
Figure 11:
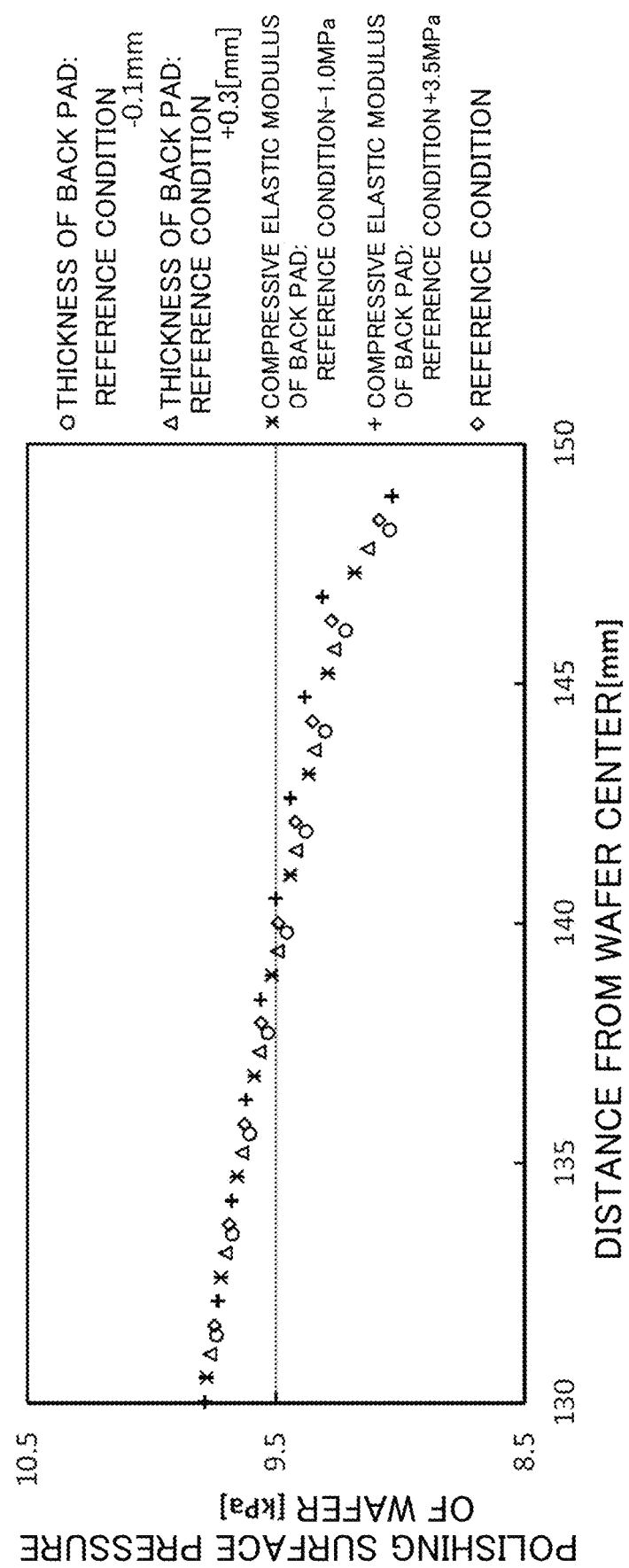
FIG. 11 is a graph indicating an in-plane distribution of the polishing surface pressure that is applied to the polishing target surface of the workpiece in Example 1 (where the thickness of the back pad and the compressive elastic modulus of the back pad are changed, and the outer peripheral portion control pressure Pe is 9 kPa).
Figure 12:
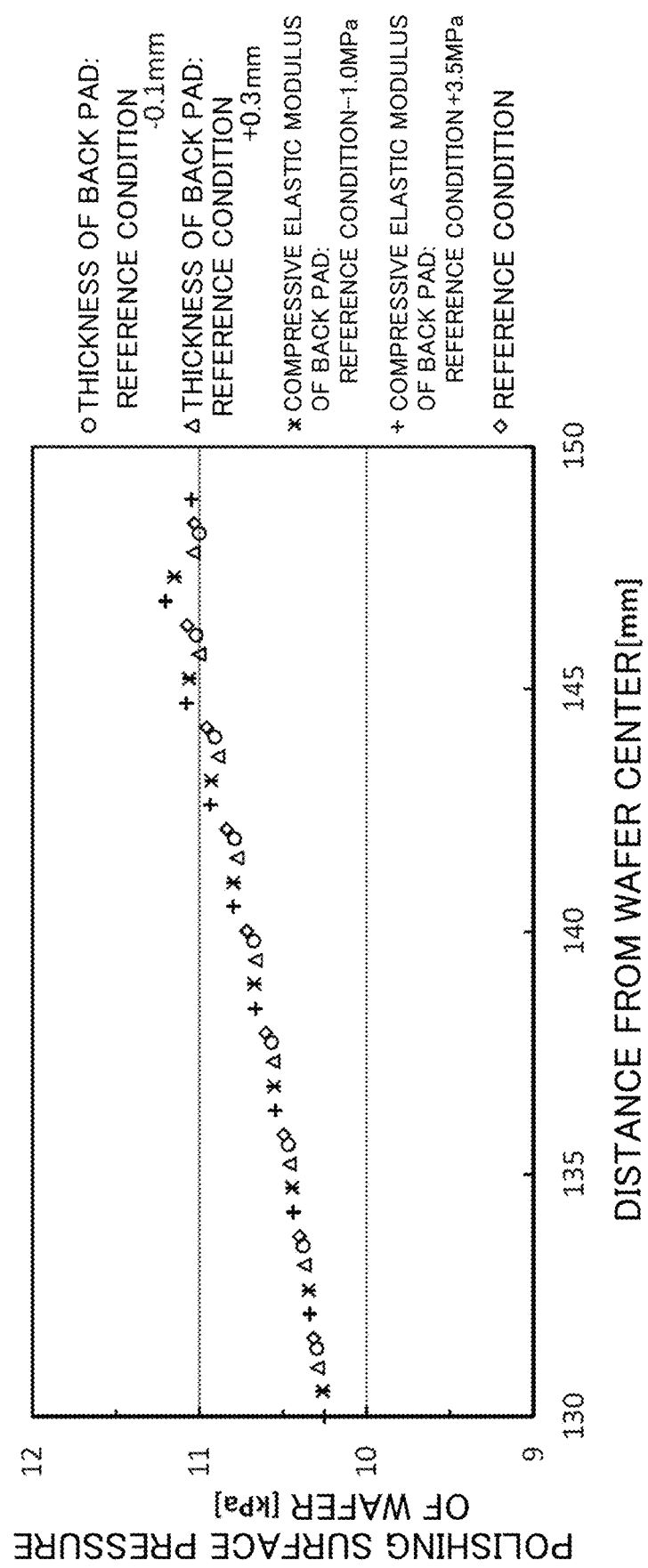
FIG. 12 is a graph indicating an in-plane distribution of the polishing surface pressure that is applied to the polishing target surface of the workpiece in Example 1 (where the thickness of the back pad and the compressive elastic modulus of the back pad are changed, and the outer peripheral portion control pressure Pe is 11 kPa).
Figure 13:
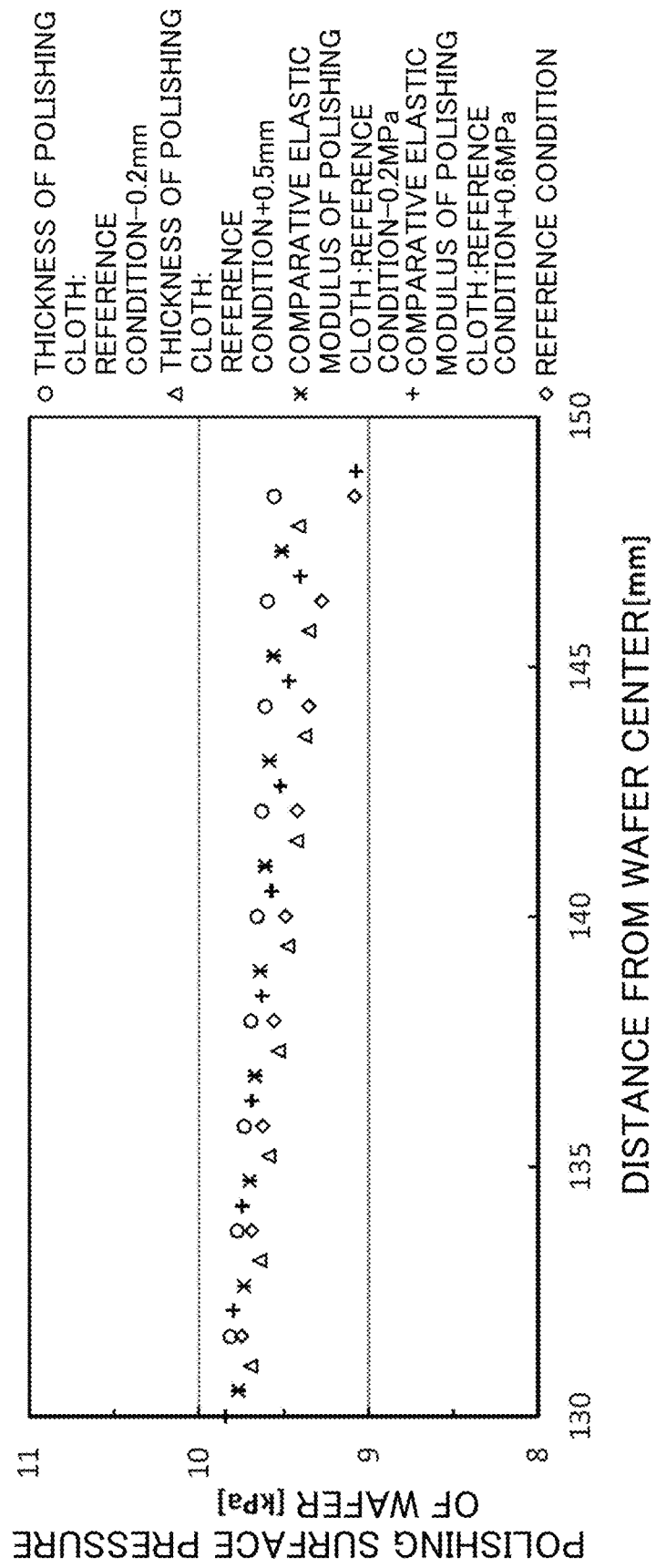
FIG. 13 is a graph indicating an in-plane distribution of the polishing surface pressure that is applied to the polishing target surface of the workpiece in Example 1 (where the thickness of the polishing pad and the compressive elastic modulus of the polishing pad are changed, and the outer peripheral portion control pressure Pe is 9 kPa).
Figure 14:
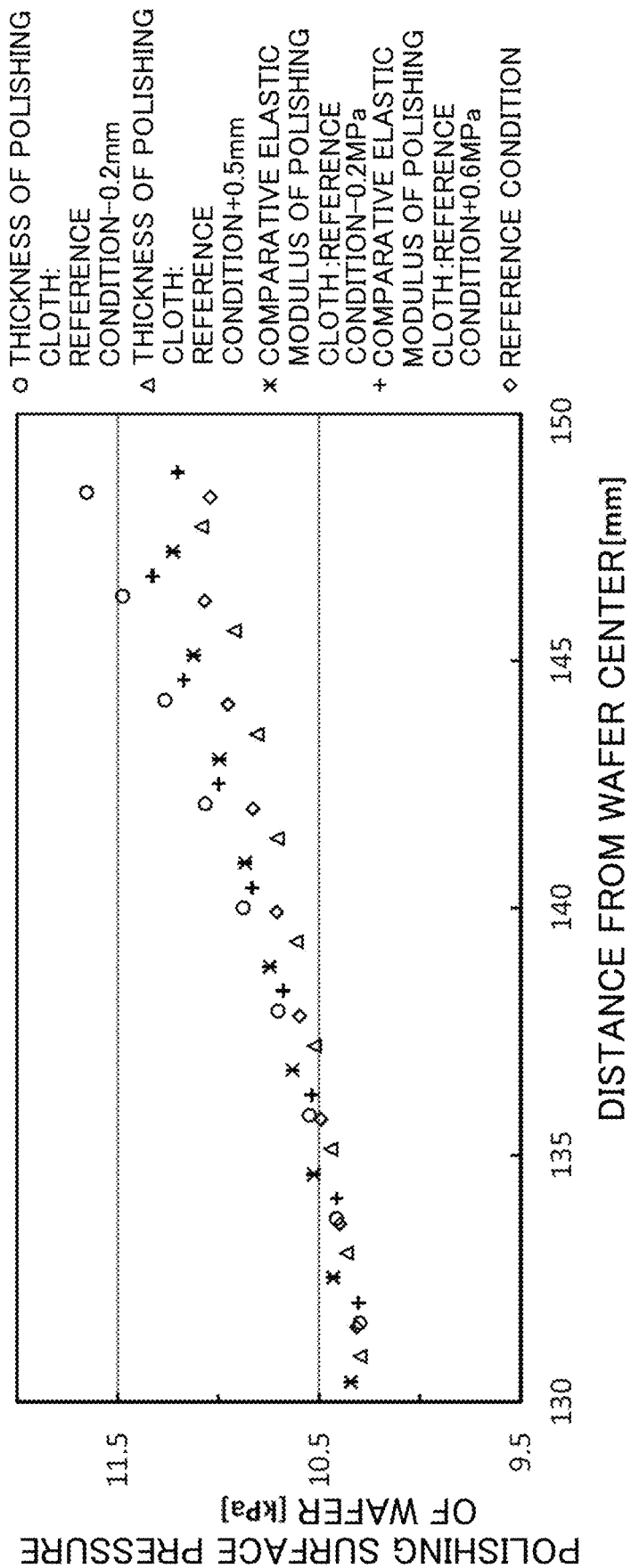
FIG. 14 is a graph indicating an in-plane distribution of the polishing surface pressure that is applied to the polishing target surface of the workpiece in Example 1 (where the thickness of the polishing pad and the compressive elastic modulus of the polishing pad are changed, and the outer peripheral portion control pressure Pe is 11 kPa).

FIG. 10 is a graph indicating an in-plane distribution of the polishing surface pressure that is applied to the polishing target surface of a 300 mm diameter silicon wafer (workpiece) in the single-side polishing apparatus equipped with the polishing head having the configuration in FIG. 3. The outer peripheral portion control pressure Pe can be changed in various ways by changing the amount of gas introduced into the outer peripheral region 17B of the space formed by closing the opening of the first ring-shaped member 12 via the gas introducing path 18B.

FIG. 11 to FIG. 14 are graphs indicting an in-plane distribution of the polishing surface pressure that is applied to the polishing target surface of a 300 mm diameter silicon wafer (workpiece) in a case where the central portion control pressure Pc is 10 kPa, and the outer peripheral portion control pressure Pe is set to 9 kPa or 11 kPa by changing the amount of gas introduced into the outer peripheral region 17B via the gas introducing path 18B. In each graph, values acquired under predetermined reference conditions and values acquired when the thickness of the back pad, compressive elastic modulus of the back pad, thickness of the polishing pad or compressive elastic modulus of a polishing pad is different from the reference condition, are plotted. As indicated in the graphs in FIG. 11 to FIG. 14, according to the polishing head used in Example 1, the polishing surface pressure that is applied to the outer peripheral portion of the polishing target surface of the wafer can be controlled even if the thickness and material (compressive elastic modulus) of the back pad or the polishing pad are changed.

Example 2

Figure 15:
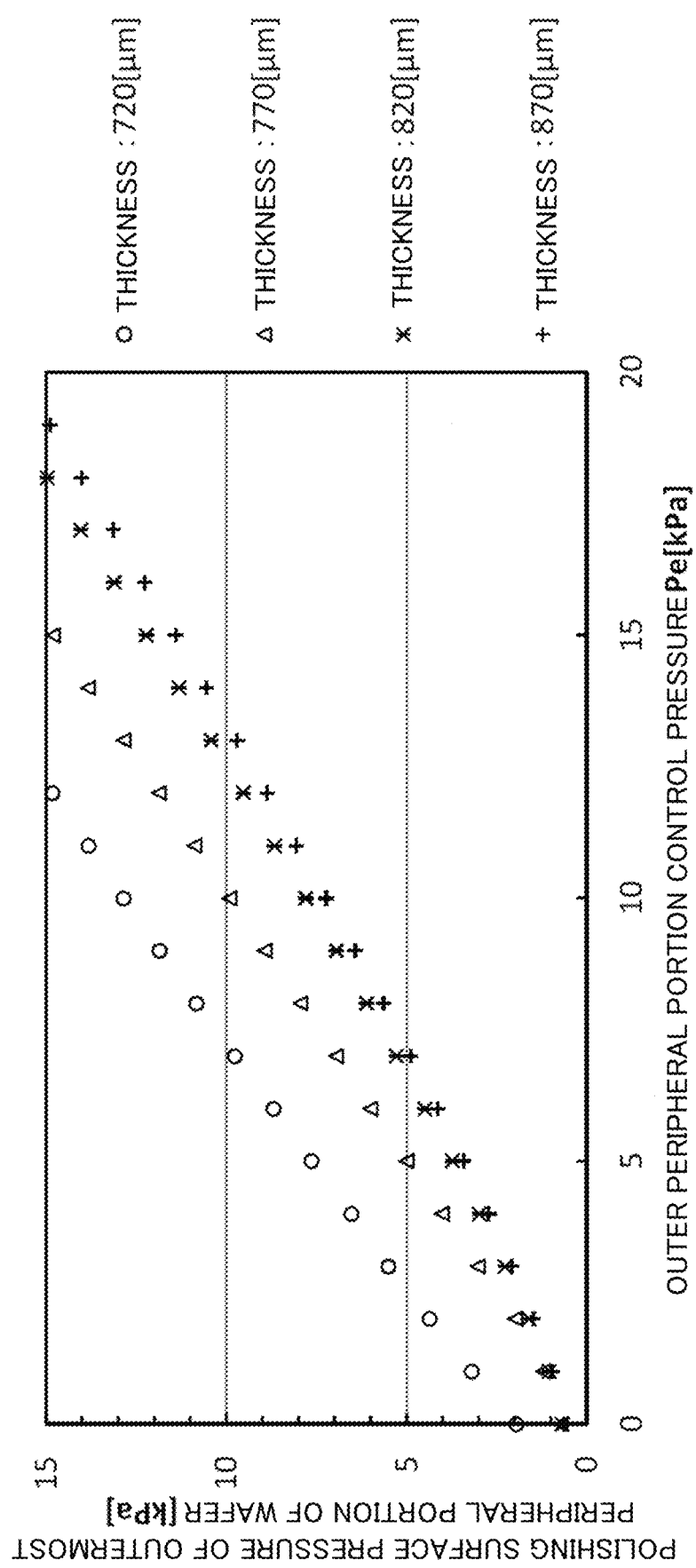
FIG. 15 is a graph indicating the polishing surface pressure that is applied to the outermost peripheral portion of the polishing target surface of the workpiece in a case of changing the thickness of the second ring-shaped member (retainer) in Example 2.

FIG. 15 indicates the polishing surface pressure that is applied to the outermost peripheral portion (distance from center of wafer: 149 mm) of the polishing target surface of the 300 mm diameter silicon wafer (workpiece), determined by pressure calculation while changing the thickness and outer peripheral portion control pressure Pe of the second ring-shaped member (retainer).

As a result, as FIG. 15 indicates, even if the thickness of the second ring-shaped member (retainer) changes, the polishing surface pressure that is applied to the outer peripheral portion of the polishing target surface of the wafer can be controlled by changing the outer peripheral portion control pressure Pe.

Example 3

Figure 16:
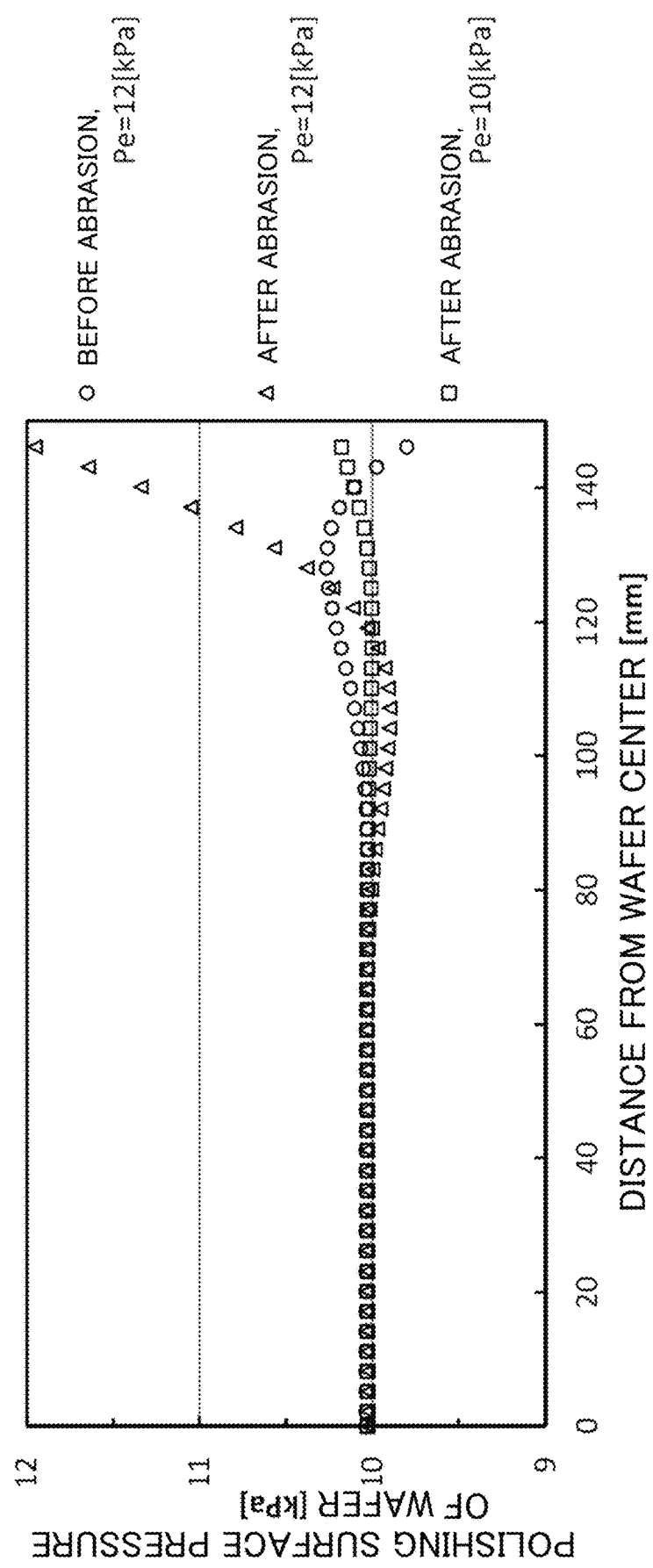
FIG. 16 is a graph indicating an in-plane distribution of the polishing surface pressure that is applied to the polishing target surface of a workpiece before and after abrasion of the second ring-shaped member in Example 3.

FIG. 16 is a graph indicating an in-plane distribution of the polishing surface pressure that is applied to the polishing target surface of a 300 mm diameter silicon wafer (workpiece) in a case where the second ring-shaped member (retainer) is polished and worn down by the slide-contacting with the polishing pad, and the thickness thereof is decreased from 820 mm to 770 mm. In the graph, values acquired when the outer peripheral portion control pressure Pe is unchanged at 12 kPa after abrasion, and values acquired when the outer peripheral portion control pressure Pe is changed to 10 kPa after abrasion are plotted. Before abrasion, the polishing surface pressure can be maintained to about 10 kPa in-plane by setting Pe to 12 kPa, but if Pe is not changed from 12 kPa after abrasion, the polishing surface pressure increases 1 kPa or more (14 nm or more when this value is converted into the polishing amount using a Preston equation) on the outer peripheral portion of the polishing target surface. In contrast, in the case of changing Pe to 10 kPa after abrasion, the polishing surface pressure can be maintained to about 10 kPa in-plane, as the result in FIG. 16 indicates.

An aspect of the present invention is useful in the technical field of semiconductor wafers, such as for silicon wafers.

The invention claimed is:

1. A polishing head comprising:
a first ring-shaped member having an opening;
a plate-shaped member that closes the opening on an upper side of the first ring-shaped member;
a membrane that closes the opening on a lower side of the first ring-shaped member;
a back pad adhered to a lower surface of the membrane, such that no space is formed between the back pad and the membrane; and
a second ring-shaped member located below the back pad and having an opening that holds a polishing target workpiece, wherein
a space, formed by closing the opening of the first ring-shaped member by the plate-shaped member and the membrane, comprises:
a central region; and
an outer peripheral region partitioned from the central region by a partition,
an inner peripheral edge region of the second ring-shaped member is located vertically below an outer peripheral edge of the outer peripheral region, and
the partition is connected to the plate-shaped member.

2. The polishing head according to claim 1,
wherein the back pad is disposed between an outer peripheral portion on the lower surface of the membrane and an annular upper surface of the second ring-shaped member.

3. The polishing head according to claim 2,
which comprises:
an introducing path that introduces gas into the central region; and
an introducing path that introduces gas into the outer peripheral region.

4. The polishing head according to claim 1,
which comprises:
an introducing path that introduces gas into the central region; and
an introducing path that introduces gas into the outer peripheral region.

5. A polishing apparatus comprising:
the polishing head according to claim 1;
a polishing pad; and
a surface plate that supports the polishing pad.

6. A method of manufacturing a semiconductor wafer, the method comprising polishing a surface of a polishing target wafer with the polishing apparatus according to claim 5 to form a polished surface.

7. The method of manufacturing a semiconductor wafer according to claim 6,
wherein the polishing head comprises:
an introducing path that introduces gas into the central region; and
an introducing path that introduces gas into the outer peripheral region.

8. The method of manufacturing a semiconductor wafer according to claim 6,
wherein the back pad is disposed between an outer peripheral portion on the lower surface of the membrane and an annular upper surface of the second ring-shaped member.

9. The method of manufacturing a semiconductor wafer according to claim 8,
wherein the polishing head comprises:
an introducing path that introduces gas into the central region; and
an introducing path that introduces gas into the outer peripheral region.

10. The polishing apparatus according to claim 5,
wherein the back pad is disposed between an outer peripheral portion on the lower surface of the membrane and an annular upper surface of the second ring-shaped member.

11. The polishing apparatus according to claim 10,
wherein the polishing head comprises:
an introducing path that introduces gas into the central region; and
an introducing path that introduces gas into the outer peripheral region.

12. The polishing apparatus according to claim 5,
wherein the polishing head comprises:
an introducing path that introduces gas into the central region; and
an introducing path that introduces gas into the outer peripheral region.

13. The polishing head according to claim 1,
wherein a height of the space is 3.5 mm to 5.5 mm in a state in which gas is not introduced into the space.

\* \* \* \* \*